United States Patent [19]
Yamada

[11] Patent Number: 5,502,320
[45] Date of Patent: Mar. 26, 1996

[54] DYNAMIC RANDOM ACCESS MEMORY (DRAM) SEMICONDUCTOR DEVICE

[75] Inventor: Takashi Yamada, Yokohama, Japan

[73] Assignee: Kabushiki Kaisha Toshiba, Kawasaki, Japan

[21] Appl. No.: 212,796

[22] Filed: Mar. 15, 1994

[30] Foreign Application Priority Data

Mar. 15, 1993 [JP] Japan .................................. 5-080116

[51] Int. Cl.$^6$ .......................... H01L 27/108; H01L 29/76; H01L 29/94; H01L 31/062
[52] U.S. Cl. ......................... 257/302; 257/301; 257/329; 257/330
[58] Field of Search .................................. 257/301, 302, 257/303, 304, 306, 311, 327, 329, 330, 331, 332, 334, 297

[56] References Cited

U.S. PATENT DOCUMENTS

| | | | |
|---|---|---|---|
| 4,243,997 | 1/1981 | Natori et al. | 257/330 |
| 4,453,305 | 6/1984 | Janes et al. | 257/330 |
| 4,630,088 | 12/1986 | Ogura et al. | 257/296 |
| 5,072,269 | 12/1991 | Hieda | 257/302 |
| 5,248,893 | 9/1993 | Sakamoto | 257/409 |

FOREIGN PATENT DOCUMENTS

| | | | |
|---|---|---|---|
| 0366882A2 | 5/1990 | European Pat. Off. | 257/302 |
| 2711523 | 10/1977 | Germany | 257/297 |
| 3801525A1 | 9/1988 | Germany | 257/302 |
| 3905634C2 | 6/1993 | Germany | 257/330 |
| 56-81974 | 7/1981 | Japan | 257/330 |
| 62-136877 | 6/1987 | Japan | 257/332 |
| 2-309670 | 12/1990 | Japan | 257/302 |

OTHER PUBLICATIONS

IBM Technical Disclosure Bulletin, vol. 33, No. 3A, 1990, pp. 72–75.
IBM Technical Disclosure Bulletin, vol. 32, No. 9A, 1990, pp. 380–382.
Electronics, Jul. 9, 1987, issue 14, pp. 75–77.
IBM Technical Disclosure Bulletin, vol. 31, No. 3, 1988, pp. 279–286.
Symposium on VLSI Technology Digest of Technical Papers, pp. 83–84, D. S. Wen, et al., "A Fully Planarized 0.25 μm CMOS Technology".
IEEE International Solid–State Circuits Conference, pp. 46–47, 1993, T. Hasegawa, et al., "An Experimental DRAM with a NAND–Structured Cell".

*Primary Examiner*—Steven H. Loke
*Attorney, Agent, or Firm*—Oblon, Spivak, McClelland, Maier, & Neustadt

[57] ABSTRACT

A semiconductor device comprising a semiconductor substrate of first conductivity type, a trench type element isolation region formed in a preset depth from the semiconductor substrate surface, an element region of the first conductivity type surrounded by the element isolation region, a gate trench for forming a gate electrode, the trench being formed in the semiconductor substrate with a smaller depth than the element isolation region and extending through the element region and element isolation region, a gate electrode buried in the bottom portion of the gate trench via a gate insulation film, and source and drain regions of a second conductivity type formed in the element region and separated from each other by the gate trench, wherein the top surface of the gate electrode lies higher than the bottom levels of the source and drain regions and lower than a contact surface of the source and drain regions.

6 Claims, 32 Drawing Sheets

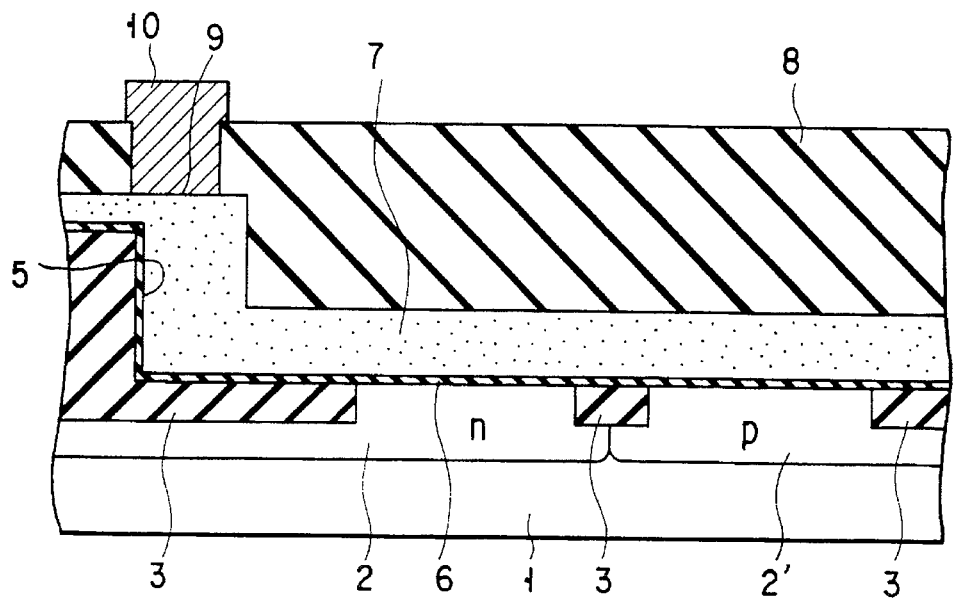
F I G. 2A
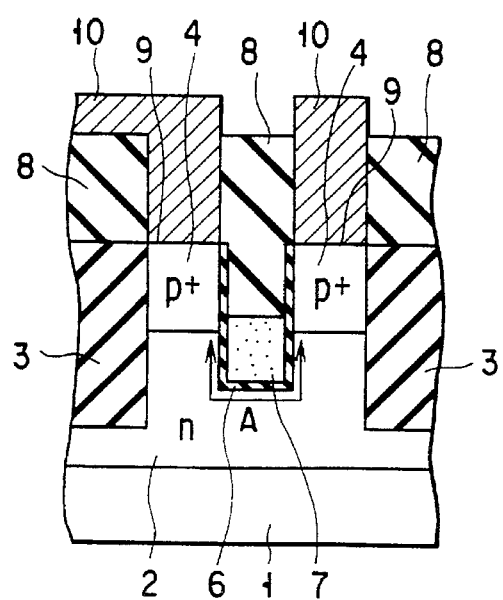
F I G. 2B

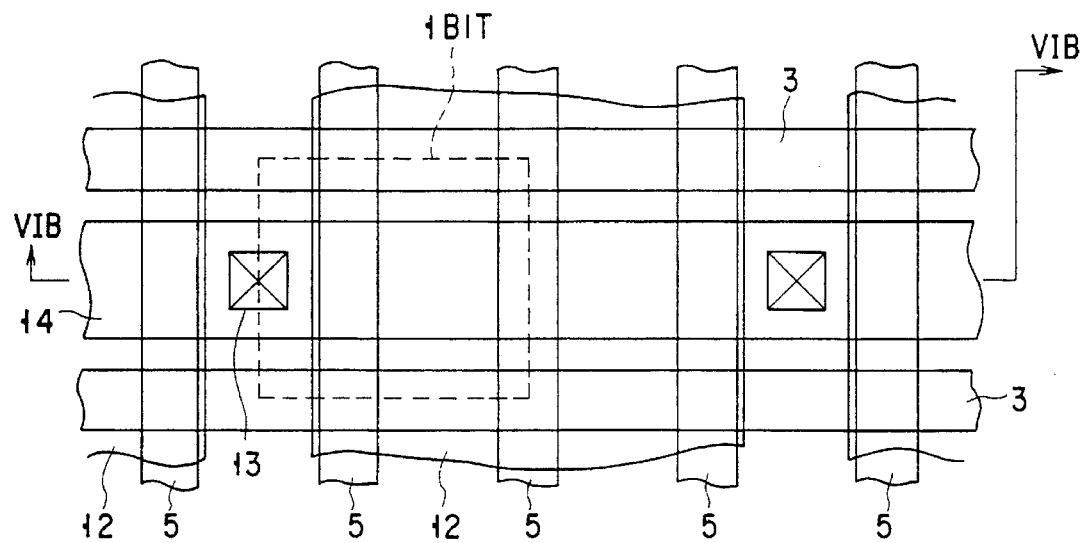
F I G. 6A
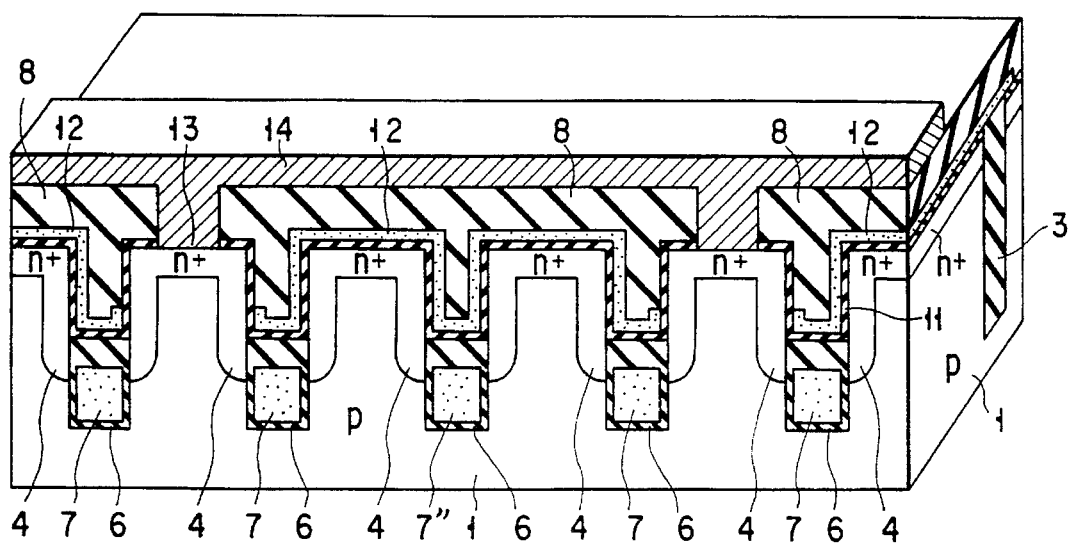
F I G. 6B

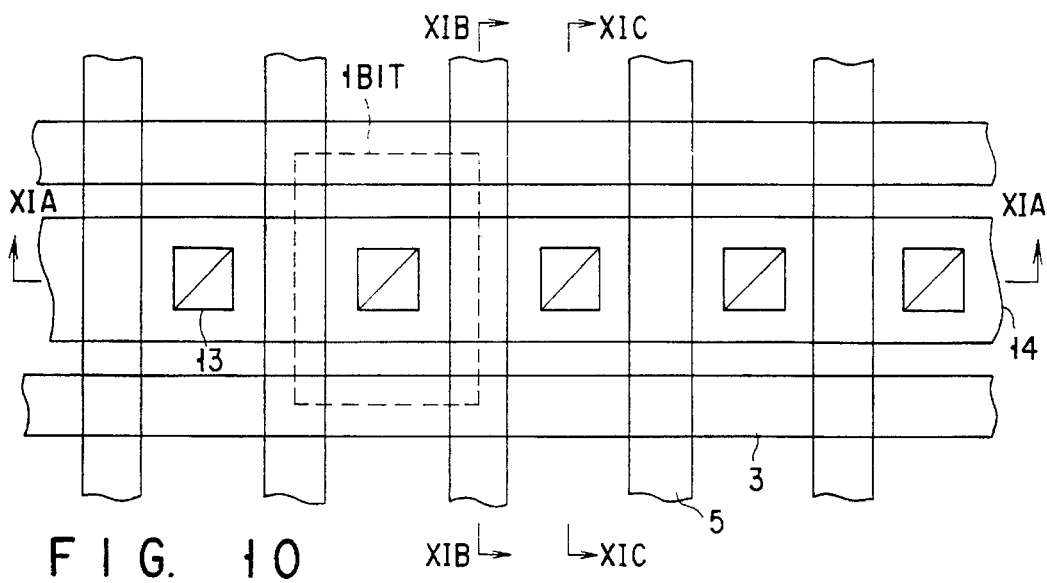
F I G. 10
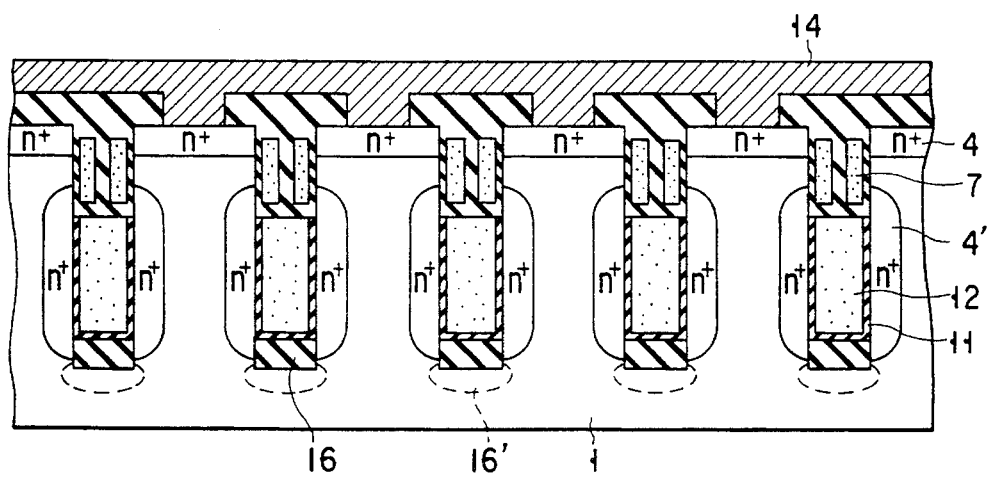
F I G. 11A
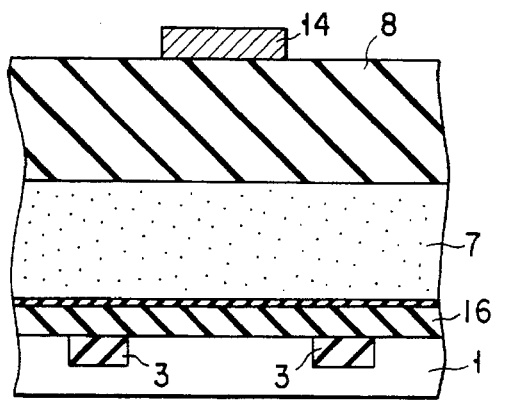
F I G. 11B
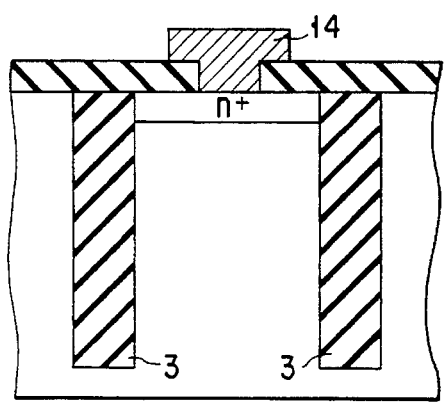
F I G. 11C

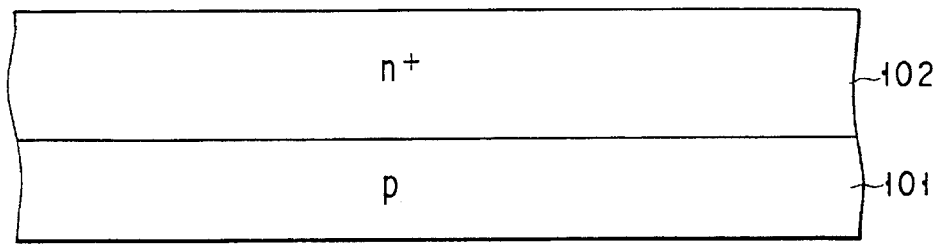
F I G. 15A
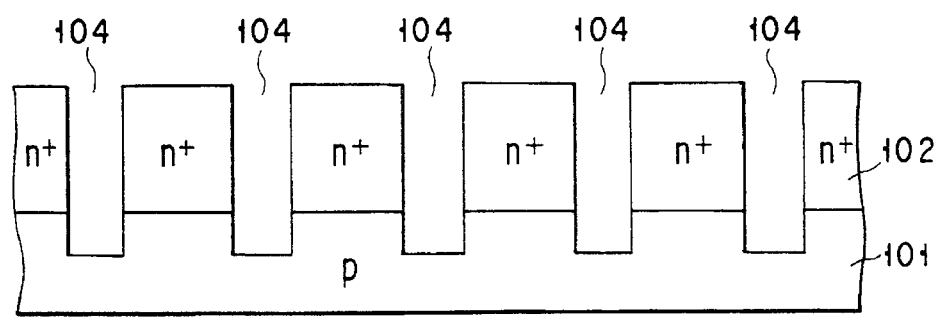
F I G. 15B
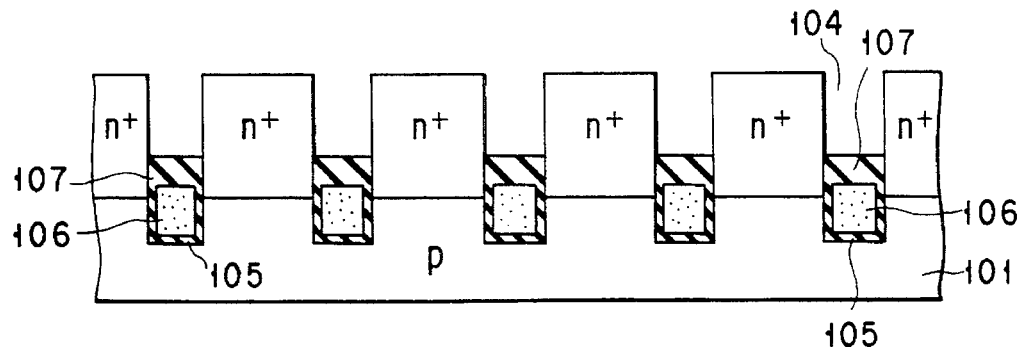
F I G. 15C
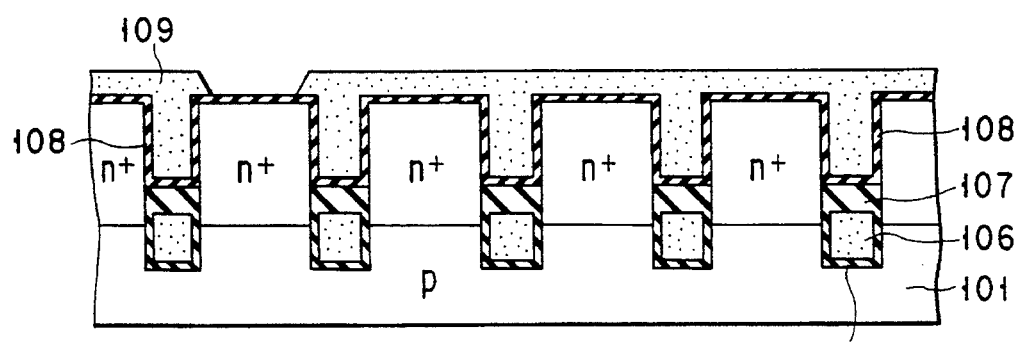
F I G. 15D

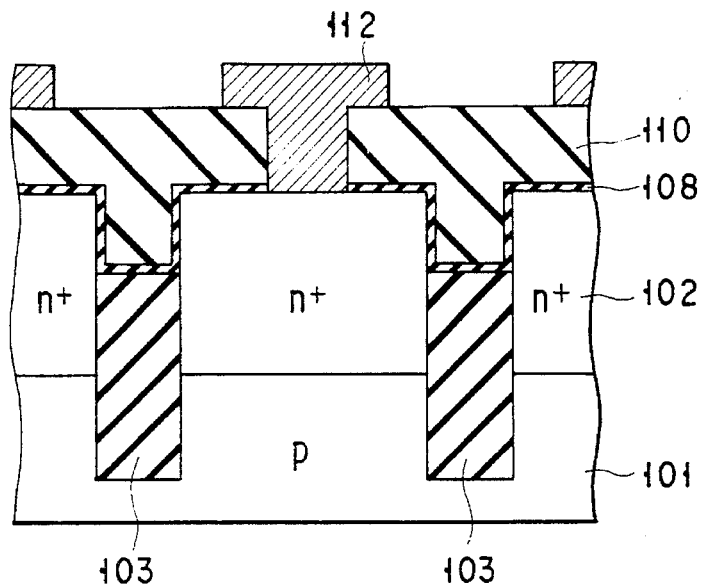
F I G. 19A
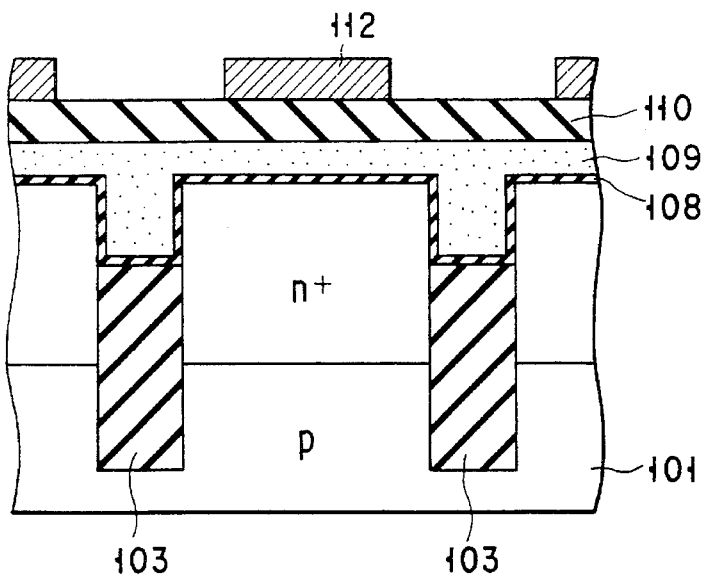
F I G. 19B
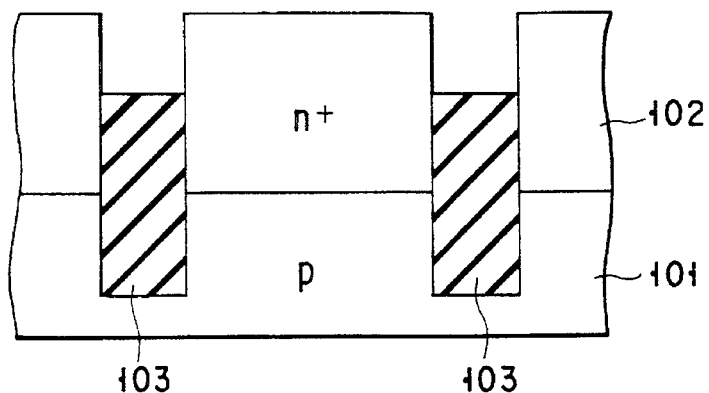
F I G. 20

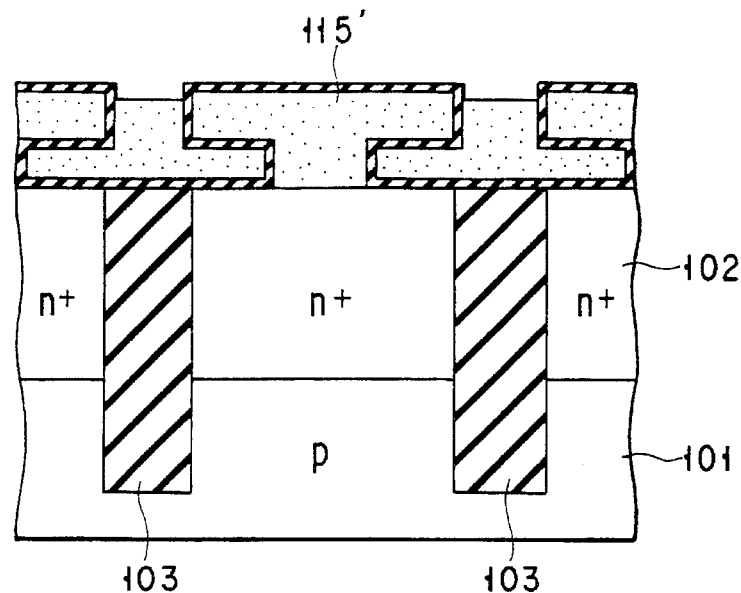
F I G. 30C
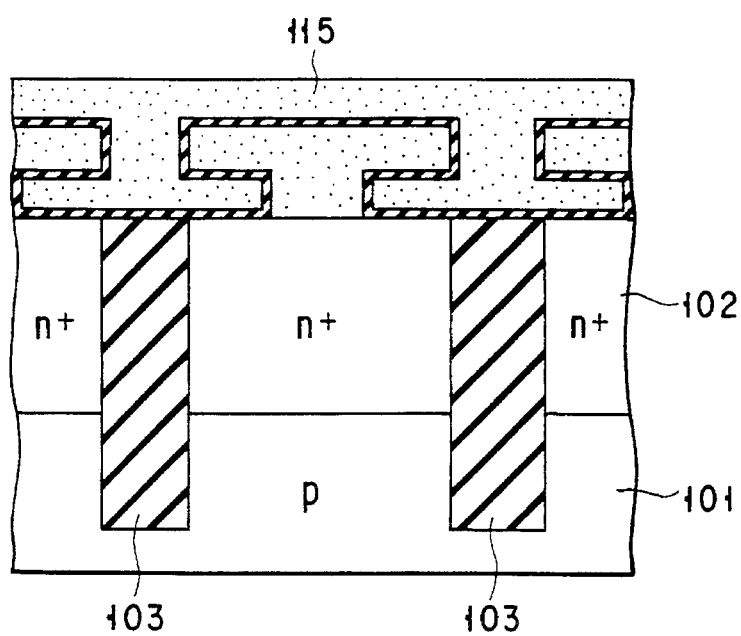
F I G. 30D

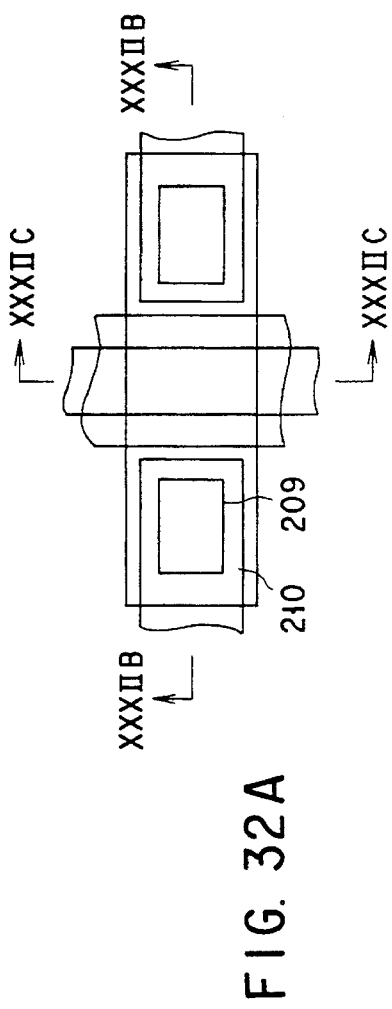
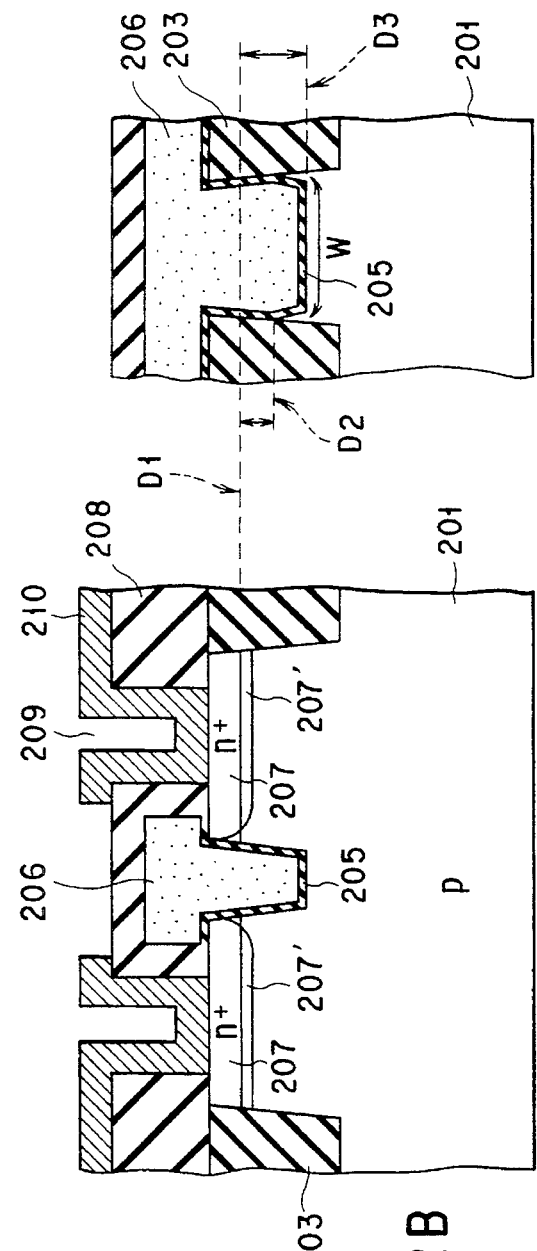
FIG. 32A
FIG. 32B
FIG. 32C

DYNAMIC RANDOM ACCESS MEMORY (DRAM) SEMICONDUCTOR DEVICE

BACKGROUND OF THE INVENTION

1. Field of the Invention

This invention relates to a semiconductor device and more particularly to a dynamic random access memory (DRAM) having an improved transistor structure.

2. Description of the Related Art

The integration density of a semiconductor integrated circuit such as a DRAM having MOS transistors becomes higher with the development of the semiconductor technology. With an increase in the integration density, the dimensions of MOS transistors constructing the integrated circuit are reduced into the sub-micron range. However, when it is required to further enhance the integration density, the following problems occur in the conventional MOS transistor and the further improvement in the integration density is limited.

The first problem is that it becomes difficult to suppress the leak current since the threshold voltage is reduced by a so-called "short channel effect" and the punch-through occurs when the gate length is reduced with miniaturization.

The second problem is that it is required to provide a mask alignment tolerance between a wiring contact for the source/drain and a gate electrode and between the contact and the element isolation area in order to stably form the wiring contact, thereby making it difficult to attain satisfactory miniaturization.

The third problem is that the sufficient surface flatness cannot be attained because of a step difference caused by formation of the gate electrode and it becomes difficult to form another wiring layer such as a bit line on the surface.

A NAND type DRAM memory cell structure in which a plurality of MOS transistors are series-connected and information storage capacitors are connected to the respective sources (or drains) of the MOS transistors is known in the art. Since, in the above series-connected type array system, the number of contacts with the bit lines can be reduced in comparison with a system other than the series-connected type array system, the cell area can be reduced.

However, the cell structure of a series-connected type array system has the following problem. That is, since a cell used in this case is a stacked type cell having a stacked capacitor and the cell area is small, it is required to form a capacitor with large height in order to attain necessary storage capacitance (Cs). As a result, an extremely large step difference of 1 μm or more is formed on the substrate structure used when an upper wiring layer such as a bit line is formed and it becomes extremely difficult to form the upper wiring layer.

With the above condition taken into consideration, a so-called concave type MOS transistor, that is, a MOS transistor having a groove formed in the channel portion to increase the effective channel length, is expected as a transistor to be further miniaturized. Since it is difficult to miniaturize the concave type transistor when the conventional LOCOS isolation is used, the element isolation by trench isolation is used in the concave type transistor.

However, since the channel is formed along the groove surface of the trench in the concave type MOS transistor, the following problem occurs. That is, since the electric field from the gate electrode for controlling the channel formation is diverged in the bottom corner portion of the trench because of the shape thereof, a channel with high conductivity cannot be formed in this portion. As a result, the channel resistance increases and a sufficiently large driving ability cannot be attained.

SUMMARY OF THE INVENTION

An object of this invention is to provide a semiconductor device which includes a MOS transistor and has the following advantages.

The first advantage is that a sufficiently large gate length can be attained even when the element is miniaturized with an increase in the integration density.

The second advantage is that contacts of wirings for the source and drain can be formed in self-alignment with the gate electrode and element isolation region.

The third advantage is that no step difference by formation of the gate electrode is formed on the substrate surface.

The above object can be attained by a semiconductor device comprising a semiconductor substrate of first conductivity type; a trench type element isolation region formed in a preset depth from the semiconductor substrate surface; an element region of the first conductivity type surrounded by the element isolation region; a gate trench for forming a gate electrode, the trench being formed in the semiconductor substrate with a smaller depth than the element isolation region and extending through the element region and element isolation region; a gate electrode buried in the bottom portion of the gate trench via a gate insulation film; and source and drain regions of a second conductivity type formed in the element region and separated from each other by the gate trench; wherein the top surface of the gate electrode lies between the bottom levels of the source and drain regions and the surface of the semiconductor layer.

This invention includes the following preferable embodiments.

(1) A capacitor is formed by use of at least a part of the gate trench so that a semiconductor memory device is formed as a whole.

(2) The capacitor is formed in a position higher than the gate electrode.

(3) A stopper film is formed on the gate electrode buried in the trench, the stopper film functioning as an etching stopper when contact holes for the source and drain regions are formed by a suitable etching process.

(4) The effective channel width of the MOS transistor is increased by forwardly tapering the side walls of the element isolation trench and the gate trench.

According to a semiconductor device of this invention, a channel can be formed along the gate trench, not only in a direction parallel to the substrate surface but also in a direction perpendicular thereto. Therefore, even if the plane dimensions of the MOS transistor is reduced, a sufficiently large channel length can be attained.

In addition, since the gate electrode is formed in position a deeper than the contact surfaces of the source and drain regions, a large vertical distance is obtained between the top surface of the gate electrode and the contact surface. Therefore, even when the gate electrode is set closer to the contacts of the source and drain regions in the plane pattern, the possibility of a short circuit of the gate electrode to the source and drain regions via the source- and drain-electrode will not occur because of the large vertical distance. As a result, the contact can be formed in self-alignment with the gate electrode.

Further, since the gate electrode is formed in a deeper position and the source and drain diffusion layers can be formed with sufficient depth, the junction characteristic will not be deteriorated because of a large vertical distance to the junction even when the contact falls on the boundary between the diffusion layers and the element isolation region. Therefore, the contact can be formed in self-alignment with the element isolation region.

Furthermore, since the gate electrode is completely buried in both of the element regions and element isolation region, no step difference due to the gate electrode occurs. Therefore, the contact and wiring can be easily formed in the succeeding process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A is a cross sectional view taken along the line IIA—IIA of FIG. 1A and FIG. 2B i a cross sectional view taken along the line IIB—IIB of FIG. 1A;

FIG. 6A is a plan view showing the construction of the memory cell structure of a DRAM according to a second embodiment of this invention and FIG. 6B perspective cross sectional view taken along the line VIB—VIB of FIG. 6A;

FIG. 10 is a plan view showing the construction of the memory cell structure of a DRAM according to a fifth embodiment of this invention;

FIGS. 11A, 11B and 11C are cross sectional views respectively taken along the lines XIA—XIA, XIB—XIB and XIC—XIC of FIG. 10;

FIGS. 14A—14D, 15A—15D, 16A—16D, 17A—17D and 18A are views for illustrating the manufacturing process for the DRAM according to the sixth embodiment shown in FIGS. 12 and 13A to 13D;

FIGS. 19A and 19B are cross sectional views for illustrating a DRAM according to a seventh embodiment of this invention;

FIG. 20 is a cross sectional view showing a method for attaining the DRAM according to the seventh embodiment of this invention shown in FIGS. 19A and 19B;

FIGS. 27 to 28A, 28B, 28C and 28D together with FIGS. 29 to 30A, 30B, 30C and 30D are views for illustrating the main steps for manufacturing the DRAM cell shown in FIGS. 25 to 26A, 26B, 26C and 26D;

FIG. 32A is a plan view showing the element structure of a transistor according to a thirteenth embodiment of this invention and FIGS. 32B and 32C are cross sectional views respectively taken along the lines XXXIIB—XXXIIB and XXXIIC—XXXIIC of FIG. 32A.

DETAILED DESCRIPTION OF THE PREFERRED EMBODIMENTS

There will now be described an embodiment of this invention with reference to the accompanying drawings.

[Embodiment 1]

Figure 1A:
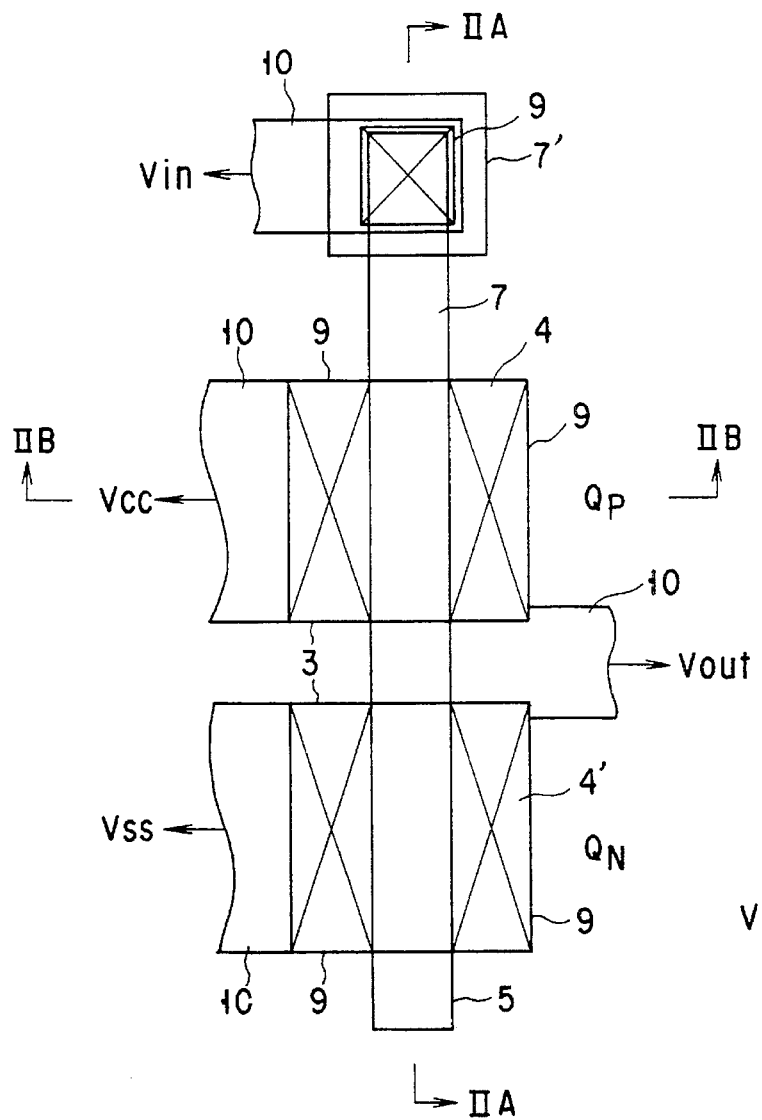
FIG. 1A is a plan view of a CMOS inverter according to a first embodiment of this invention and FIG. 1B is an equivalent circuit diagram of the CMOS inverter.
Figure 1B:
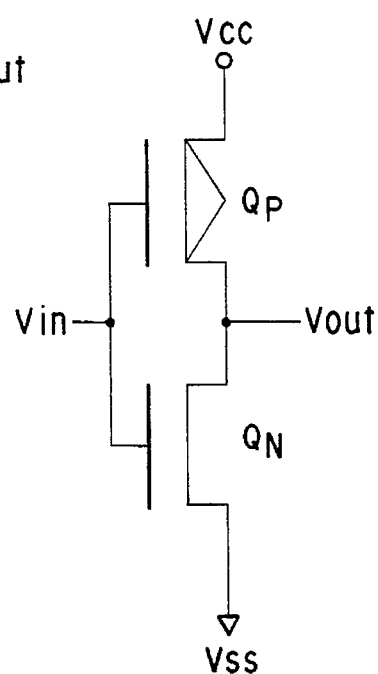

FIG. 1A is a plan view of a CMOS inverter according to a first embodiment of this invention and FIG. 1B is an equivalent circuit diagram of the CMOS inverter. FIG. 2A is a cross sectional view taken along the line IIA—IIA of FIG. 1A and FIG. 2B is a cross sectional view taken along the line IIB—IIB of FIG. 1A.

In the drawings, a reference numeral 1 indicates a silicon substrate. An n-type well region 2 and a p-type well region 2' are formed in the silicon substrate 1 (FIG. 2A). In the respective well regions, element regions surrounded by a trench isolation region 3 are formed. In the respective element regions, a p-channel MOS transistor $Q_p$ and an n-channel MOS transistor $Q_N$ are formed. The MOS transistors $Q_p$, $Q_N$ are formed to be completely buried in a gate trench 5. Further, as shown by an arrow A in FIG. 2B, it has the same channel structure as that of the concave type MOS transistor.

Next, the manufacturing method for the above element is explained. First, after formation of the wells 2, 2', the element isolation region 3 is formed by forming a deep trench filled with an insulation film. Then, phosphorus (or As) and boron are doped by ion-implantation to form the diffusion layer 4, 4' for source regions and drain regions of the transistors $Q_p$, $Q_N$. The diffusion layer 4 and 4' are deeply formed to reach a gate electrode 7 which will be described later, but no problem occurs since the element isolation is attained by the deep trench isolation region 3.

Next, the silicon layer of the element region and the insulation film of the element isolation region 3 are etched to form a gate trench 5 for forming a gate electrode, thereby dividing each of the diffusion layer 4, 4' into a source region and a drain region. In this etching process, it is possible to simultaneously etch both of the silicon layer and insulation film by use of an etchant having substantially the same etching rate for the silicon layer and the insulation film. Alternatively, it is possible to etch them by using different etchants and the same mask pattern. The critical matter is that both of the element region and the element isolation region are etched to form the gate trench 5 which is shallower than the trench element isolation region 3 and is sufficiently deep so as to have at least the gate electrode 7 buried therein.

A gate insulation film 6 made of silicon oxide film or the like is formed, and then, the gate electrode 7 made of polysilicon or the like is formed on the gate insulation film. At this time, the gate electrode 7 may be so formed that the entire portion thereof can be completely buried in the gate trench 5. However, in this embodiment, the end portion of the gate electrode 7 is lead out to the exterior of the gate trench 5 and a pattern 7' for forming a contact with a wiring 10 is formed on the end portion. At this time, in order to enhance the integration density, the width of the gate trench 5 must be reduced. In this case, since the channel can be formed along the vertical surface of the trench 5 as described before, the effective channel length A which is large enough to prevent occurrence of the short channel effect can be attained.

The source region and drain region 4, 4' may be formed by impurity ion-implantation with the gate electrode 7 used as a mask when the gate electrode 7 has been formed, if necessary. The ion-implantation at this time is preferably effected after a stopper film is formed on the gate electrode in order to prevent implanted ion from penetrating to the gate electrode 7. The source region and drain region 4, 4' may be formed only either by the ion-implantation effected at this time or by the impurity doping process effected prior to formation of the gate trench, or by a combination of the ion-implantation and the impurity doping process.

Next, an inter-level insulation film 8 is formed, contact holes are formed, and then the wirings 10 are formed. As a result, contacts 9 between the wirings 10 and the source/drain region 4, 4' as well as contacts 9 between the wirings 10 and gate electrode 7 are formed. It should be noted that the dimensions of the contact holes on the source region and drain region 4, 4' are the same as the dimensions of the source region and drain region 4, 4' and that there is no alignment tolerance. The reason why the alignment tolerance is not necessary is as follows. First, since the gate electrode 7 is buried in a deep position so as to obtain a large vertical distance between the top surface of the gate electrode and the contact surface, the possibility of a short circuit between the wiring 10 and the gate electrode 7 will not occur even if the position of the contact hole is deviated. Second, since the junction of the source and drain region is sufficiently deep, the possibility of the junction break by the wiring 10 will not occur even if the position of the contact hole is deviated to cover the isolation region 3. Thus, it is not necessary to provide the margin in a portion around the contact hole, thereby making it possible to attain further miniaturization of the MOS transistor.

Figure 3A:
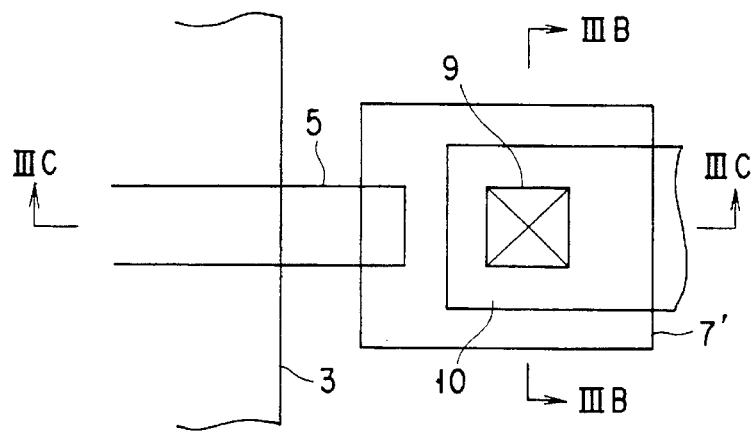
FIG. 3A is a plan view for illustrating a modification of a gate electrode lead-out structure in the embodiment of FIG. 1A to 2B.
Figure 5A:
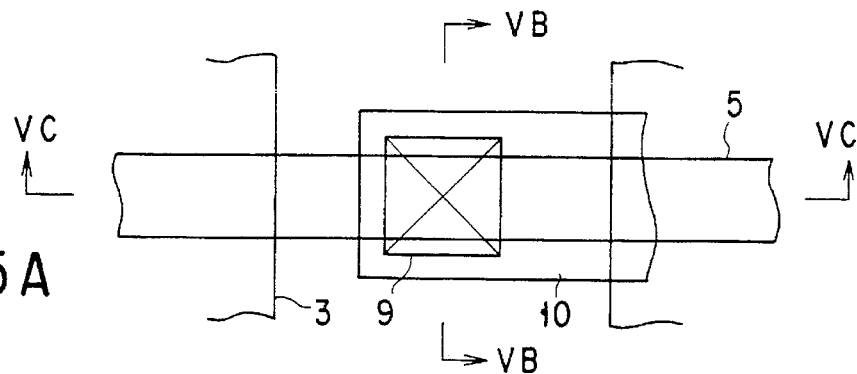
FIG. 5A is a plan view for illustrating a modification of a gate electrode lead-out structure in the embodiment of FIG. 1A to 2B.
Figure 5B:
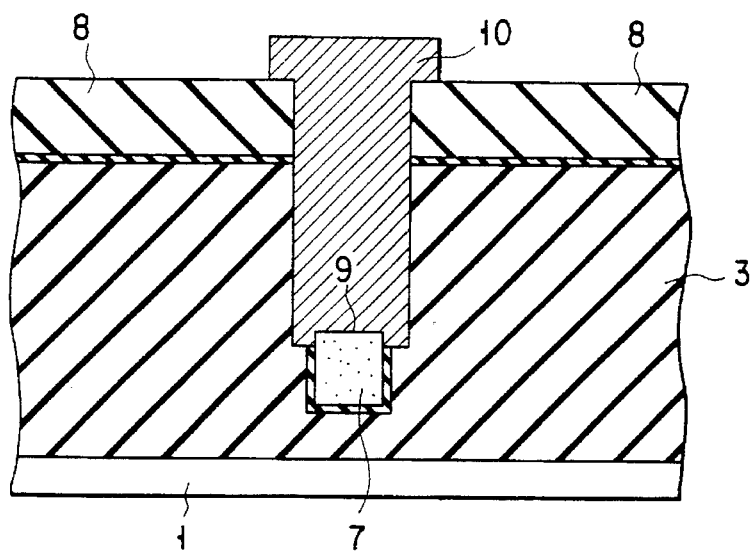
FIG. 5B is a cross sectional view taken along the line VB—VB of FIG. 5A
Figure 5C:
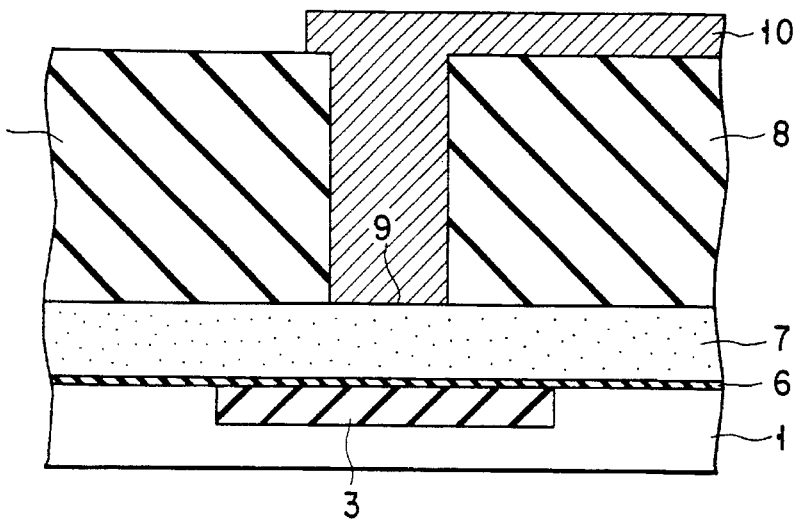
FIG. 5C is a cross sectional view taken along the line VC—VC of FIG. 5A.

FIGS. 3A to 5C illustrate modifications of the lead-out structure of the gate electrode 7 in the first embodiment. FIGS. 3A, 4A, 5A are plan views, FIGS. 3B, 4B, 5B are cross sectional views respectively taken along the lines B—B of FIGS. 3A, 4A, 5A, and FIGS. 3C, 4C, 5C are cross sectional views respectively taken along the lines C—C of FIGS. 3A, 4A, 5A. In order to easily form a contact between the wiring 10 and the gate electrode 7, it is desirable to form the contact outside the groove of the gate trench 5. Therefore, as shown in FIGS. 3A to 3C and 4A to 4C, for example, it is desirable to form a gate electrode lead-out pattern 7' outside the gate trench 5 and form a contact between the wiring 10 and the pattern 7'. However, as shown in FIG. 5A to 5C, it is also possible to directly form a contact for the gate electrode 7 buried in the trench 5 without forming the lead-out pattern 7'.

Figure 3B:
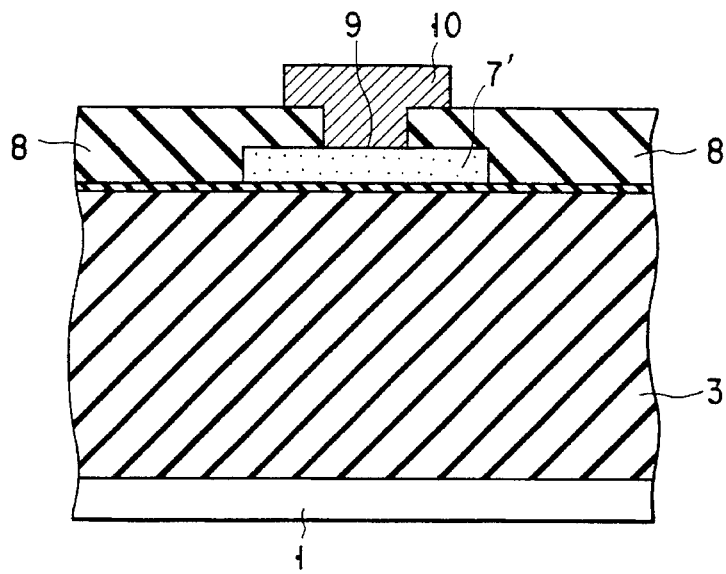
FIG. 3B is a cross sectional view taken from along the line IIIB—IIIB of FIG. 3A
Figure 3C:
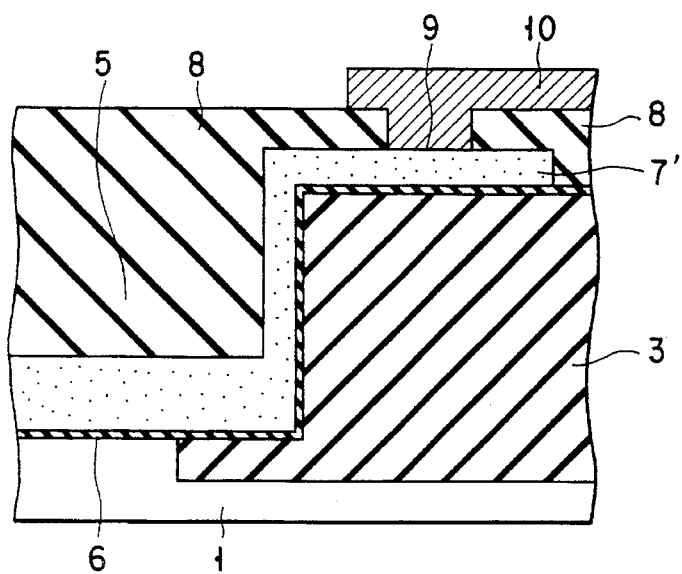
FIG. 3C is a cross sectional view taken along the line IIIC—IIIC of FIG. 3A.
Figure 4A:
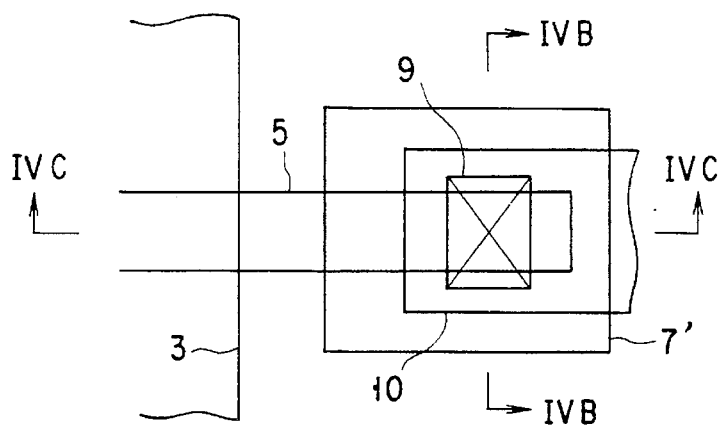
FIG. 4A is a plan view for illustrating a modification of a gate electrode lead-out structure in the embodiment of FIG. 1A to 2B.
Figure 4B:
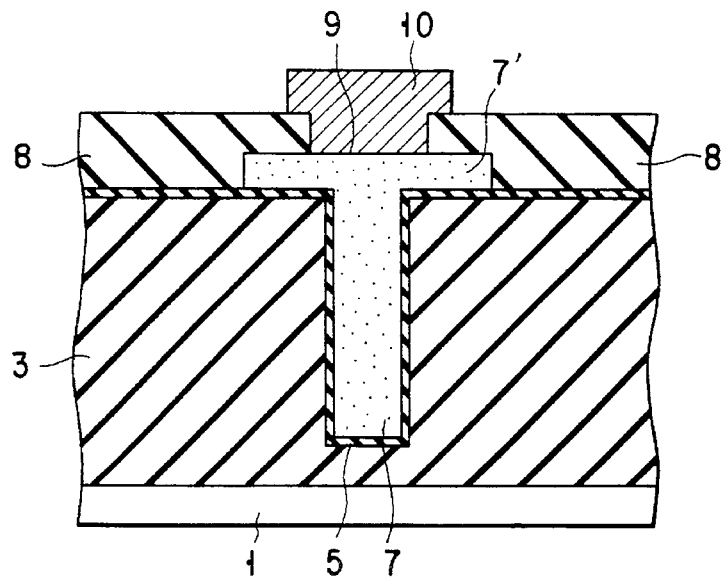
FIG. 4B is a cross sectional view taken along the line IVB—IVB of FIG. 4A
Figure 4C:
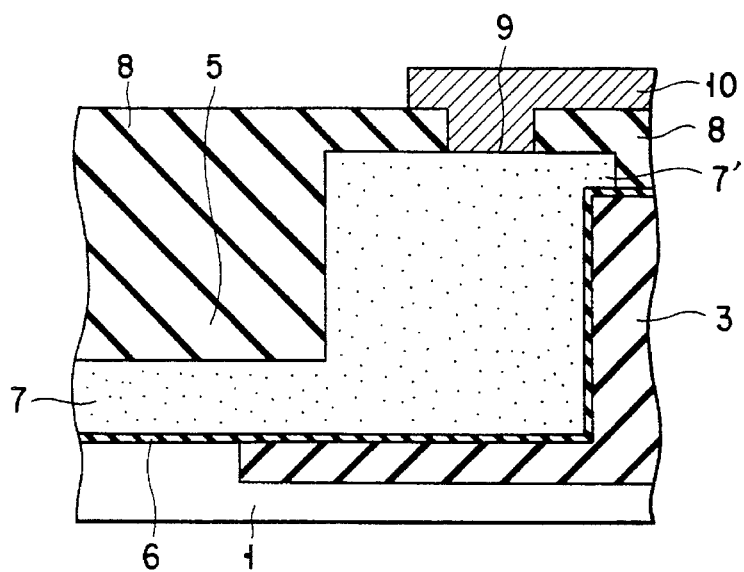
FIG. 4C is a cross sectional view taken along the line IVC—IVC of FIG. 4A.

Like the first embodiment, in the case shown in FIG. 3A to 3C, the lead-out pattern 7' connected to the gate electrode 7 is formed outside the area of the gate trench 5 at the same time as the gate electrode 7 is patterned. Therefore, the contact between the gate electrode 7 and the wiring 10 is formed outside the area of the gate trench 5. In an example of FIG. 4A to 4C, the lead-out pattern 7' is formed inside the area of the gate trench 5 but is disposed above the trench groove, and the contact 9 is also formed above the trench 5.

In an example of FIG. 5A to 5C, the lead-out pattern 7' is not used. Therefore, the gate electrode 7 is kept buried in the groove of the trench 5. The contact 9 in this case is formed by etching the insulation film 8 to form a contact hole which reaches the buried gate electrode 7. At this time, the contact 9 can be formed not only on the top surface of the gate electrode 7 but also on the side surface thereof by making the width of the contact hole larger than the width of the gate trench 5 as shown in FIG. 5B. As a result, the contact area can be increased and the contact resistance can be reduced.

[Embodiment 2]

FIG. 6A and 6B are views showing a second embodiment of this invention applied to the memory cell structure of a DRAM. FIG. 6A is a plan view showing the DRAM and FIG. 6B is a perspective cross sectional view taken along the line VIB—VIB of FIG. 6A.

In this embodiment, one DRAM memory cell is constructed by one MOS transistor and one capacitor. The MOS transistor is completely buried in a gate trench 5 and the capacitor is formed along the wall surface of the gate trench 5 and the surface of the substrate 1. With this structure, a DRAM memory cell which can be miniaturized and is excellent in surface flatness can be attained. In addition, since plate electrode 12 is formed on the entire surface of the substrate 1, wiring resistance of the plate electrode 12 can be reduced to maintain a stable electric potential thereof, thereby enhancing the tolerance against noise imposed on bit lines and word lines.

Note that the plate electrode 12 may be flatly formed on the surface of the substrate 1 without being buried in the gate trench 5.

In order to manufacture the DRAM memory, a linear element isolation trench 3 is first formed in the silicon substrate 1 to attain the element isolation in the word line direction. Then, so-called trench isolation is realized by burying an insulation film such as a silicon oxide film in the trench 3. Next, in order to form the word line 7, a linear gate trench 5 is formed. It is preferable to form the gate trench 5 with a smaller depth than the element isolation trench 3 so as to maintain the element isolation ability of the isolation trench 3 high. Then, after forming the gate insulation film 6 such as a silicon oxide film, the word line 7 and electrode 7" formed of phosphorus doped polysilicon film are formed in the gate trench 5.

The electrode 7" is not used as a word line but functions as an electrode for isolating two memory cells lying on both sides thereof. That is, two memory cells adjacent in the bit line direction are electrically isolated from each other by keeping a MOS transistor having the electrode 7" as a gate in the OFF state. For this purpose, the potential of the electrode 7' is set to a fixed potential level which can keep the above MOS transistor in the OFF state.

The word line 7 and electrode 7" are formed by the etchback technique which is well known in the art. In order to lower the wiring resistance of the word line 7, a shunt for a plurality of cells is formed by use of a metal wiring of Al, for example. In the shunt forming area, a contact between the word line 7 and the metal wiring can be formed by use of one of the methods shown in FIGS. 3 to 5.

Next, As or P (phosphorus) is ion-implanted as n-type impurity and annealed to form source and drain regions 4. The ion-implantation is preferably carried out so as to prevent channeling after the word line 7 is protected by oxidizing the upper portion of the word line 7 formed of polysilicon or burying another insulation film on the upper portion of the word line. Note that, as explained in the first embodiment, impurity doping for forming the source and drain regions 4 may be effected after forming the trench isolation 3 and before forming the gate electrode forming trench 5. In this embodiment, the source/drain region 4 also functions as a storage electrode of the capacitor.

Next, a capacitor insulation film 11 such as an ONO (oxide-nitride-oxide) film is formed and a plate electrode 12 of phosphorus doped polysilicon film is formed. In this embodiment, the plate electrode 12 is formed with a small thickness so as not to completely fill the gate trench 5 and isotropic etching is used for formation of the plate electrode. As a result, the plate electrode 12 is separated in the depth direction from the surface of the silicon substrate 1 on which the bit line contact 13 is formed. Therefore, occurrence of a short circuit between a bit line 14 and the plate electrode 12 can be easily prevented.

Then, after forming an inter-level insulation film 8, a contact hole for the bit line contact 13 is formed and the bit line 14 is formed to complete the semiconductor device.

[Embodiment 3]

Figure 7A:
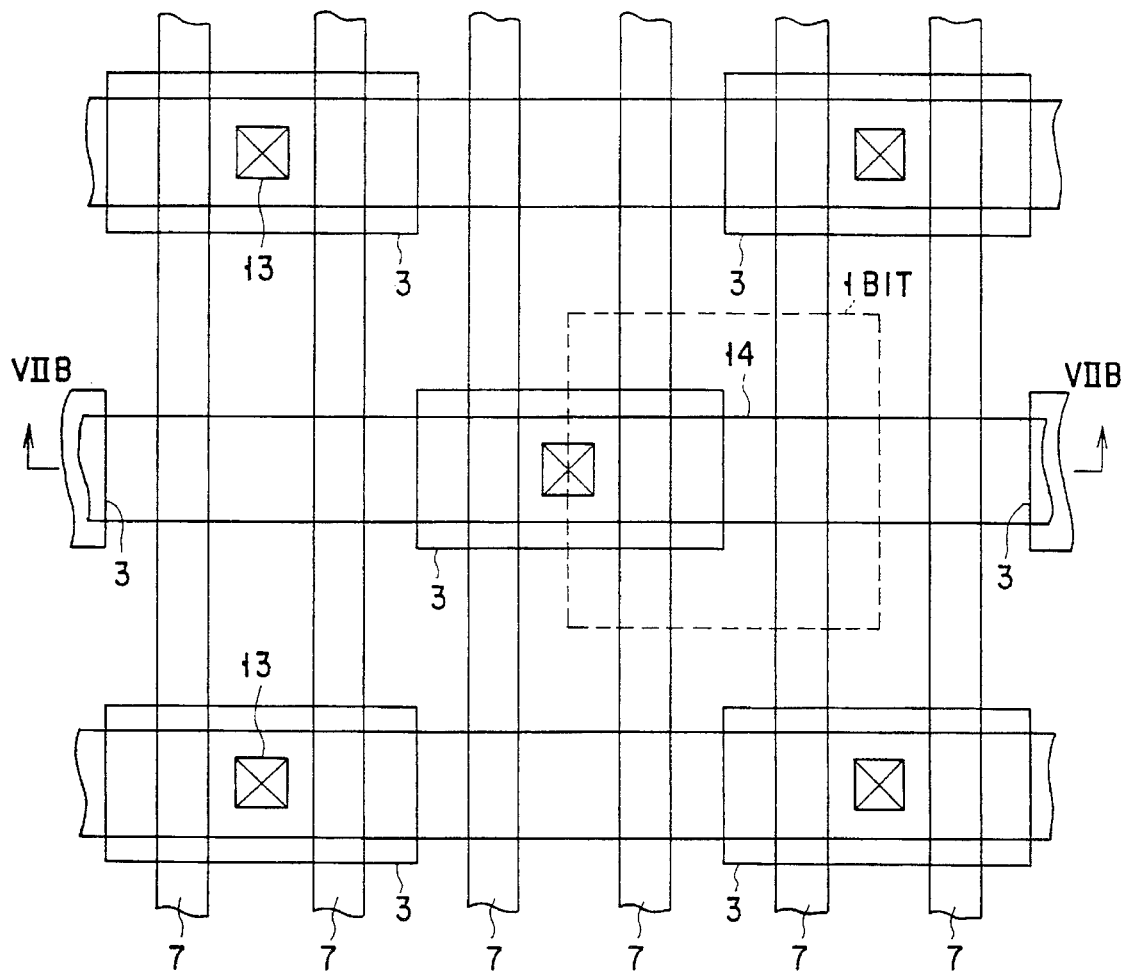
FIG. 7A is a plan view showing the construction of the memory cell structure of a DRAM according to a third embodiment of this invention and FIG. 7B is a cross sectional view taken along the line VIIB—VIIB of FIG. 7A.
Figure 7B:
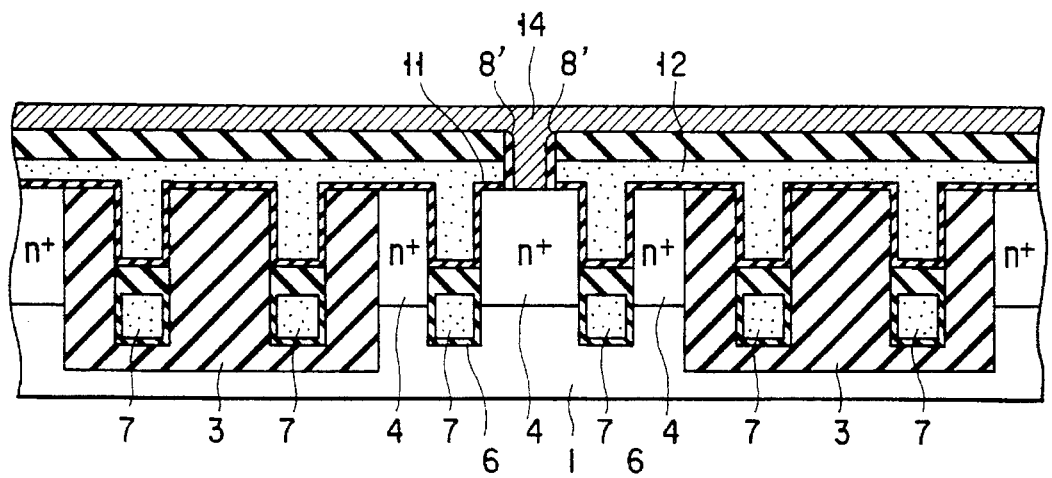

FIG. 7A, 7B are views showing the memory cell structure of a DRAM according to a third embodiment of this invention. FIG. 7A is a plan view of the DRAM and FIG. 7B is a cross sectional view taken along the line VIIB—VIIB of FIG. 7A.

In the second embodiment of FIG. 6, memory cells for constructing the cell array of so-called open bit line configuration are shown. In contrast, in the embodiment of FIG. 7, memory cells for constructing the cell array of folded bit line configuration are shown.

Like the case of FIG. 6, the memory cell of this embodiment is constructed by a completely buried concave 10 type MOS transistor and a capacitor formed thereon. However, a trench isolation region 3 which is first formed in this embodiment is different from the linear trench of FIG. 6 and is formed to surround the island element region.

Further, in this embodiment, a plate electrode 12 is also formed in the bit line contact area. Therefore, a bit line contact 13 is formed as follows. First, at the time of formation of a contact hole, the etching is stopped at the plate electrode 12, and after this, the plate electrode 12 is etched away and then an underlying capacitor insulation film 11 is etched away to form the contact hole. Further, an insulation film 8' is formed on the side wall of the contact 13 to prevent occurrence of a short circuit between a bit line 14 and the plate electrode 12, and then the bit line 14 is formed.

In the embodiment 2 described above, since the plate electrode 12 is formed on the entire surface of the substrate 1 except only the bit line contact area, more stable potential of the plate electrode 12 and higher noise tolerance can be achieved in comparison with the case of the Embodiment 2. Considering from an opposite view point, also in the Embodiment 2, it is possible to form the plate electrode 12 on the entire surface of the substrate 1 except the bit line contact area.

It should be noted that the plate electrode 12 of the Embodiment 2 may be formed without being buried in the gate trench 2, as specifically noted in the Embodiment 2.

[Embodiment 4]

Figure 8:
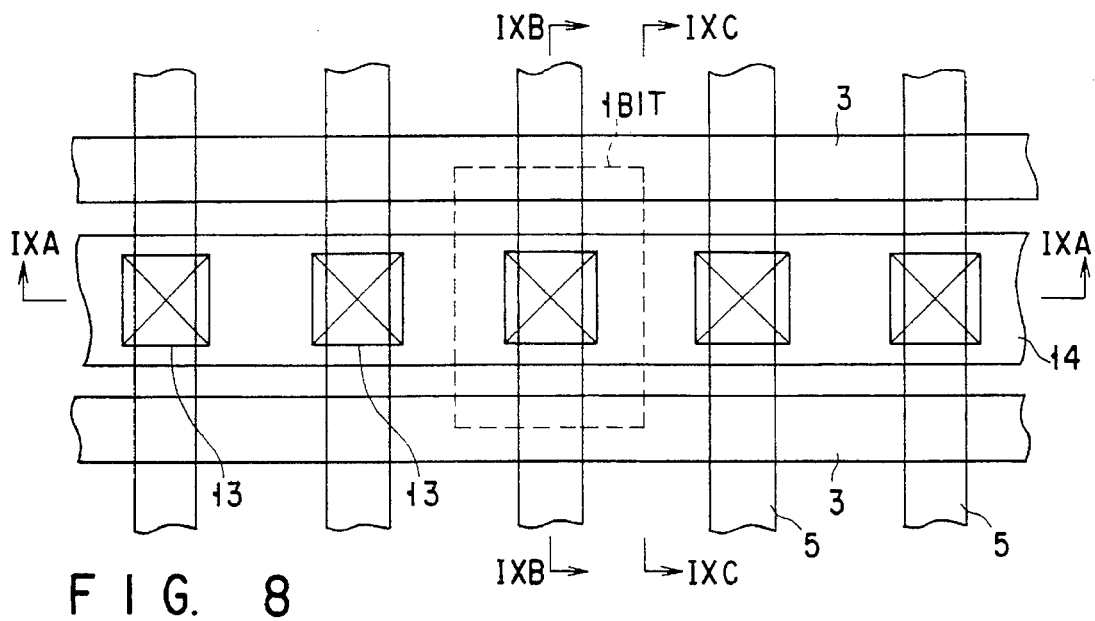
FIG. 8 is a plan view showing the construction of the memory cell structure of a DRAM according to a fourth embodiment of this invention.
Figure 9A:
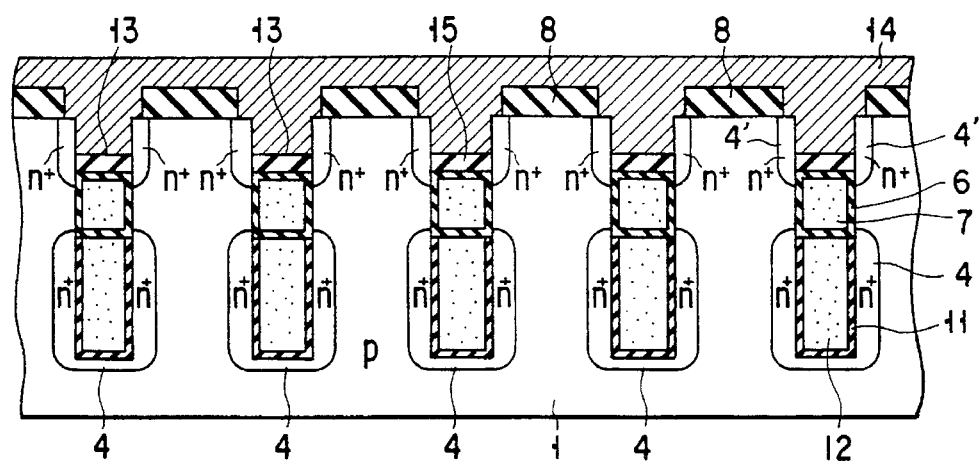
FIGS. 9A, 9B and 9C are cross sectional views respectively taken along the lines IXA—IXA, IXB—IXB and IXC—IXC of FIG. 8.
Figures 9B, 9C:
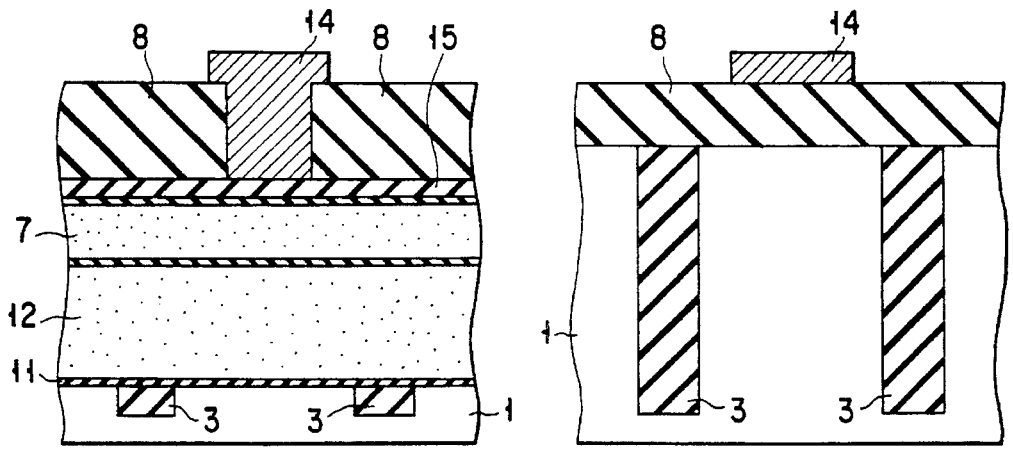

FIG. 8 and FIGS. 9A to 9C show the memory cell structure of a DRAM according to a fourth embodiment of this invention. FIG. 8 is a plan view of the DRAM, FIG. 9A is a cross sectional view taken along the line IXA—IXA of FIG. 8, FIG. 9B is a cross sectional view taken along the line IXB—IXB of FIG. 8, and FIG. 9C is a cross sectional view taken along the line IXC—IXC of FIG. 8.

This invention is not limited to a configuration in which the capacitor is formed above the buried gate electrode as in the second embodiment of FIGS. 6A and 6B or the third embodiment of FIG. 7A and 7B. The fourth embodiment of FIG. 8 and FIGS. 9A, 9B shows an example in which the capacitor is formed below the buried gate electrode. In this embodiment, a so-called cross point type cell structure is employed, wherein one-bit memory cell is formed in each area in which the word line and the bit line are crossed over.

In this embodiment, one bit memory cell comprising one capacitor and a pair of MOS transistors is formed with a parallel structure for each gate electrode 7. That is, the paired MOS transistors commonly using the gate electrode 7 are formed along two opposing vertical side 10 walls of the trench 5 in which the gate electrode 7 is buried. The drain regions 4 of the two MOS transistors are connected together and used as a storage electrode of the capacitor. Therefore, the paired MOS transistors function as a single transistor. Further, a plate electrode 12 formed of polysilicon is buried below the gate electrode 7 and extended along the word line in the trench 5 as a lower-level wiring under the word line 7. As a result, one bit memory cell is formed along the wall of one gate trench 5.

Note that it is possible to employ an inverse structure in which the plate electrode 12 is formed on the gate electrode 7 in the gate trench 5.

The DRAM of the fourth embodiment can be formed as follows. First, in order to attain the element isolation in the direction of the word line 7, a linear pattern element isolation trench 3 is formed. Then, after the gate trench 5 is formed, a diffusion layer 4 used as the storage electrode and the drain region is formed. If the oblique ion-implantation is used for formation of the diffusion layer 4, n-type impurity is ion-implanted into the entire portion (including the channel portion) of the side wall of the trench. However, in this case, if additional channel ion-implantation is effected after formation of the plate electrode 12 so as to control the threshold value of the MOS transistor, an operable MOS transistor can be formed. Alternatively, the diffusion layer 4 may be selectively formed in the storage electrode portion by using a suitable method.

The plate electrode 12 is buried into the gate trench 5 with the capacitor insulation film 11 disposed therebetween and then the gate electrode (word line) 7 is buried with the gate insulation film 6 disposed therebetween. After this, a stopper film 15 is formed on the word line 7. At this stage, the source region 4' is formed. Then, an inter-level insulation film 8 is formed and a bit line contact 13 and bit line 14 are formed.

Formation of the bit line contact 13 has a feature different from that of the prior art. That is, the pattern of the bit line contact 13 is formed to overlap the word line. Further, since the bit line contact 13 is formed also on the side wall of the trench 5, the contact area becomes large and the contact resistance can be reduced.

In addition, occurrence of a short circuit between the word line 7 and the bit line 14 can be prevented by the presence of the stopper film 15. The source region 4' may be formed by use of an adequate method such as ion-implantation after forming a contact hole for formation of the bit line contact 13.

The stopper film 15 may be formed of an insulating film or conductive film. However, if the conductive film is used, in order to achieve element isolation in the word line direction, it becomes necessary to break the continuity of the conductive film by interposing therein an insulation pattern such as the trench isolation insulator 3.

As the insulation film used for the stopper film 15, it is desirable to use a silicon nitride film, for example. In this case, it is preferable to use a silicon oxide film as the inter-level insulation film 8. When the above combination is used, the following advantage can be attained. That is, in a case where the silicon oxide film 8 is etched by RIE, at the time when the silicon substrate is exposed and subjected to the RIE process, a polymer is formed and deposited on the surface of the silicon substrate. Because the polymer is resistant to the RIE, the etching is stopped. Since the polymer is also formed on the silicon nitride film, stopper ability of the nitride film is enhanced and the etching can be reliably stopped by the silicon nitride film.

It is important to note that the silicon nitride film 15 used as the stopper is formed in position lower than the silicon oxide film 8, and as a result, the silicon oxide film 8 is no more subjected to the etching process when the etching has reached the silicon nitride film 15. This is because of the following reason. That is, oxygen is generated as a reaction product by the 10 RIE process of the silicon oxide. Therefore, if the silicon oxide film 8 is still etched at the time when the etching has reached to the silicon nitride film 15, the oxygen is generated and reacts with the polymer deposited on the nitride film 15. As a result, the polymer is removed and the stopper ability of the nitride film 15 is lowered.

Therefore, in a case where the gate electrode is formed to project upwardly from the silicon substrate surface (contact forming surface) as in the conventional case, a sufficient etching stopper effect cannot be attained even when a silicon nitride film is used to protect the gate electrode against the etching. This is because the inter-level insulation film (silicon oxide film) which has an initial thickness corresponding to the total film thickness of the silicon nitride film and the gate electrode still remains at the time when the etching frontier reaches the silicon nitride film on the gate electrode and the surface of the silicon nitride film is exposed. As a result, in the conventional case, the silicon nitride film is required to function as an etching stopper when the remaining silicon oxide film is still etched. However, if the silicon oxide film is etched by RIE, oxygen is generated to significantly degrade the function of the silicon nitride film as the etching stopper.

As is clearly understood from the above description, in this embodiment, the structure in which the gate electrode 7 is buried in the gate trench 5 is extremely desirable when forming a self-alignment contact. The structural factor relating to this advantage is only the positional relation in the vertical direction between the inter-level insulation film 8, stopper film 15 and contact forming area 13. Therefore, as far as this factor is maintained, the above advantage can be obtained even if the other structural factors are variously modified.

[Embodiment 5]

FIG. 10 and FIGS. 11A to 11C collectively show the memory cell structure of a DRAM according to a fifth embodiment of this invention. FIG. 10 is a plan view of the DRAM, FIG. 11A is a cross sectional view taken along the line XIA—XIA of FIG. 10, FIG. 11B is a cross sectional view taken along the line XIB—XIB of FIG. 10, and FIG. 11C is a cross sectional view taken along the line XIC—XIC of FIG. 10.

In this embodiment, a pair of capacitors and a pair of MOS transistors are formed by use of two opposing vertical wall surfaces of a silicon column which is formed by adjacent gate trenches 5.

In the embodiment of FIG. 8 and FIGS. 9A to 9C, miniaturization by narrowing the distance between the adjacent gate trenches 5 is limited, since data items of the adjacent memory cells interfere with each other when the storage electrodes of the cells are set close to each other. Therefore, in this embodiment, as is clearly shown in FIG. 11A, the following two structures are used to isolate adjacent memory cells.

The first structure is that two gate electrodes (word lines) 7 are buried in a gate trench 5 in order to pair the two MOS transistor formed on the two opposing vertical wall surface of the silicon column. The paired MOS transistor has a common source region 4. The second structure is that an insulation film 16 is buried in the bottom portion of the gate trench 5 so as to form, in one gate trench 5, two storage electrode 4' which are electrically isolated from each other. This bottom isolation by the insulation film 16 permits to pair the two capacitors formed on the two opposing wall surfaces of the silicon column. It is possible to form a p-type diffusion layer 16' under the insulation film 16 as shown by broken lines in the drawing in order to enhance the isolation ability.

According to this embodiment, a distance of the paired MOS transistors and the paired capacitors can be made closer without any problems. Therefore, the DRAM of this embodiment can be further miniaturized by narrowing the distance between the adjacent gate trenches 5.

As a completely different method, a transistor isolation may be used, wherein the isolation is achieved by burying a conductive film via a thin insulation film and setting the potential of the conductive film at a fixed potential level.

In addition, it is possible in the Embodiment 5 to employ another structure in which the plate electrode 12 is formed on the gate electrode 7 in the gate trench 5. Furthermore, it is possible to constitute two-bit memory cells with respect to one column.

[Embodiment 6]

Figure 12:
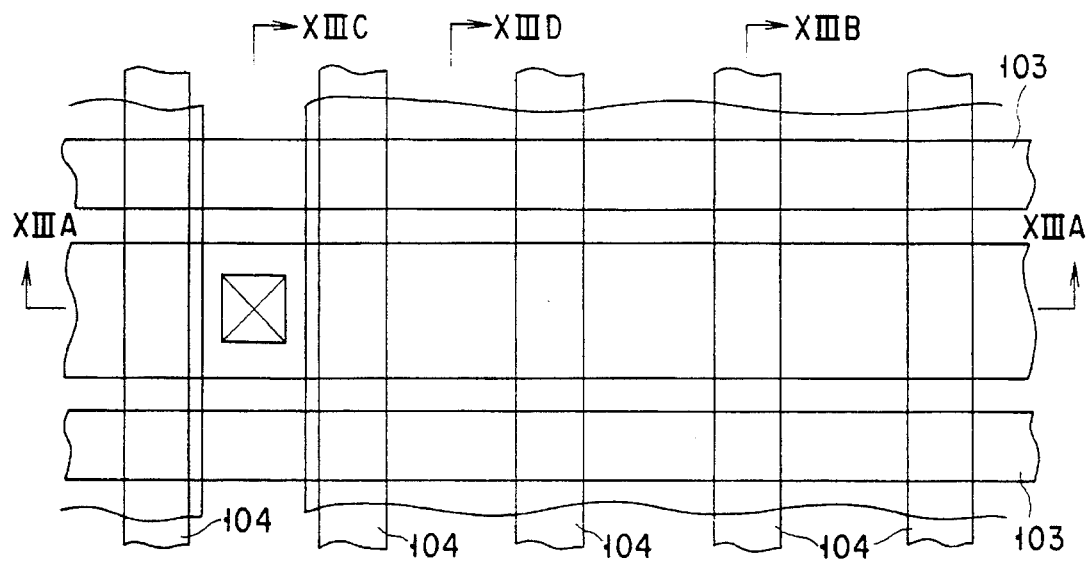
FIG. 12 is a plan view showing the construction of the memory cell structure of a NAND type DRAM according to a sixth embodiment of this invention.
Figure 13A:
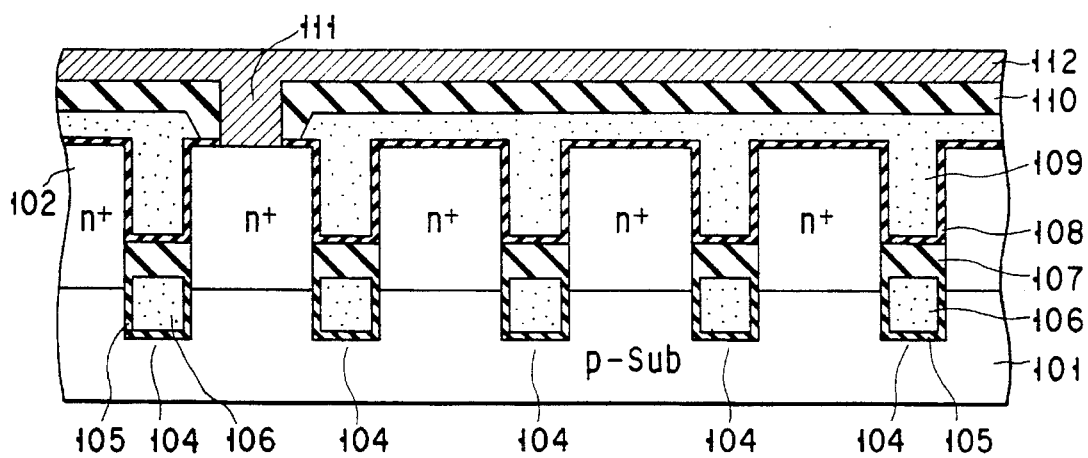
FIGS. 13A, 13B, and 13D are cross sectional views respectively taken along the lines XIIIA—XIIIA, XIIIB—XIIIB, XIIIC—XIIIC and XIIID—XIIID of FIG. 12.
Figure 13B:
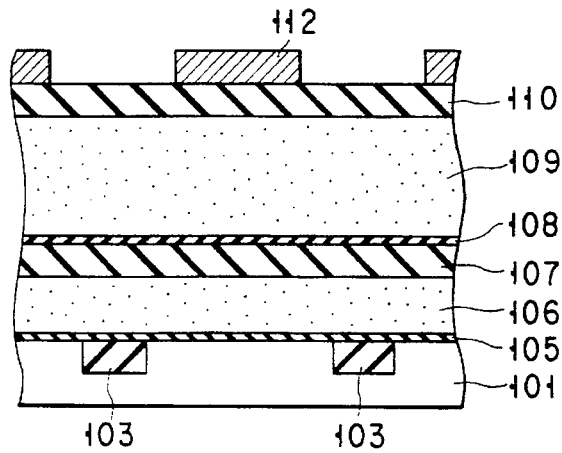
Figure 13C:
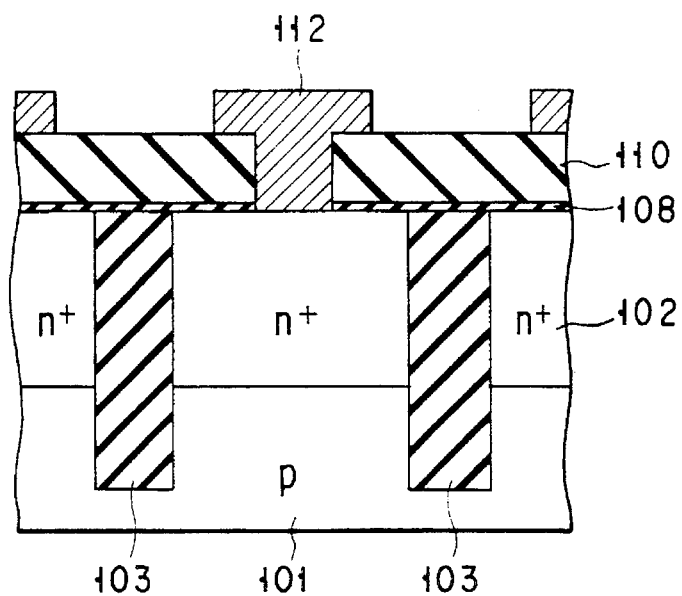
Figure 13D:
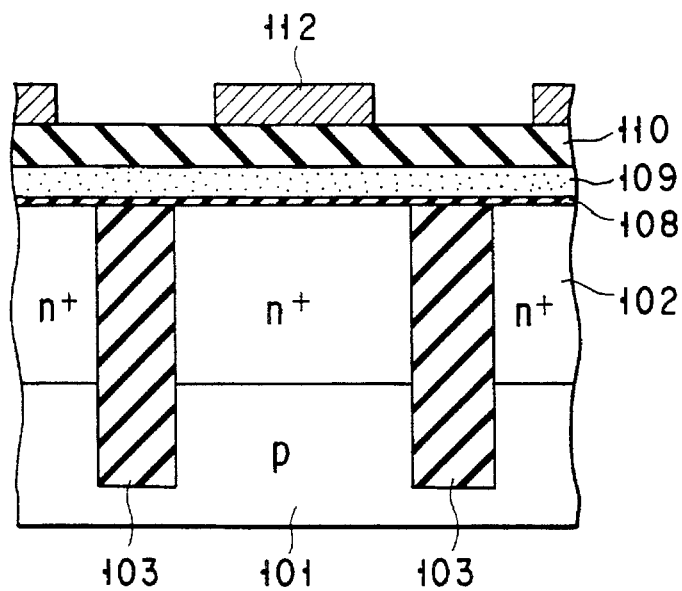
Figure 14A:
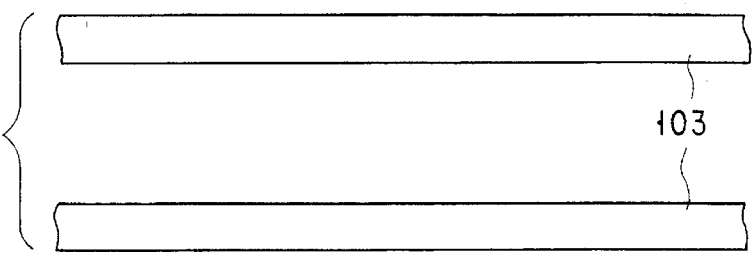
Figure 14B:
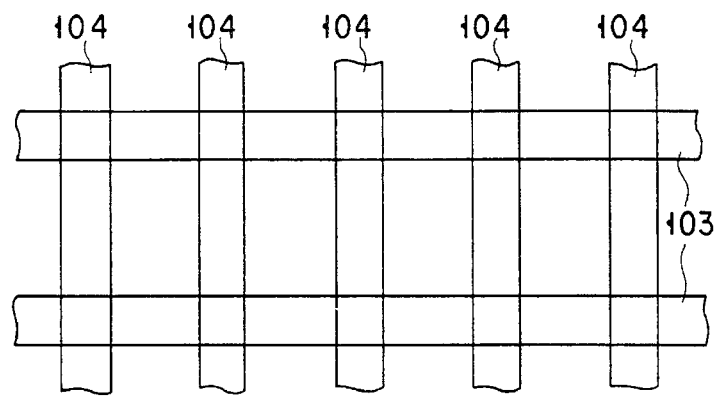
Figure 14C:
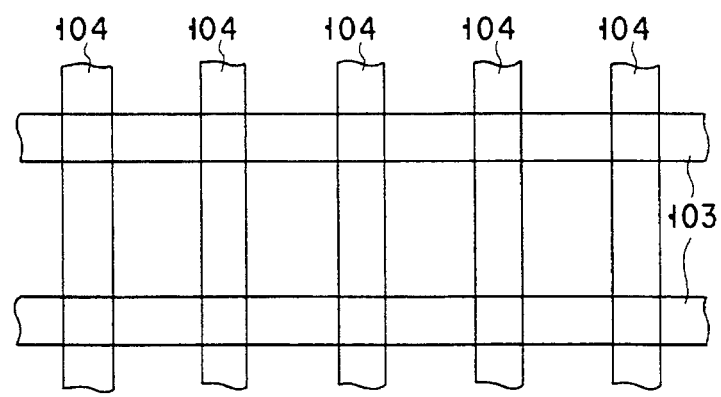
Figure 14D:
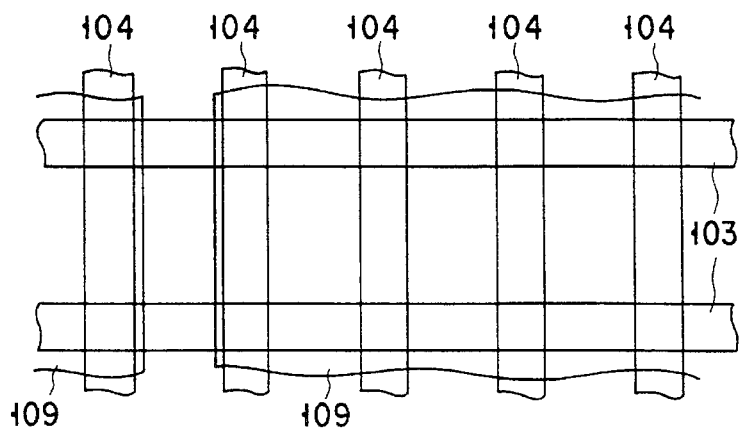
Figure 16A:
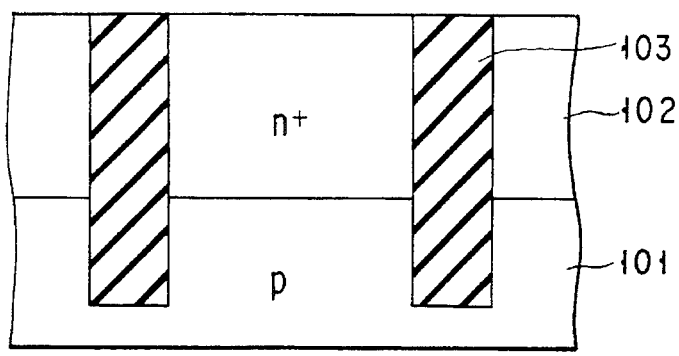
Figure 16B:
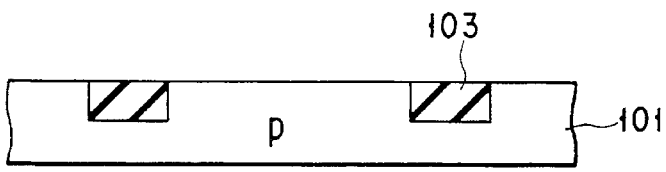
Figure 16C:
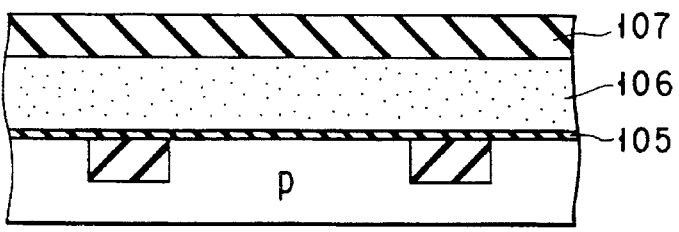
Figure 16D:
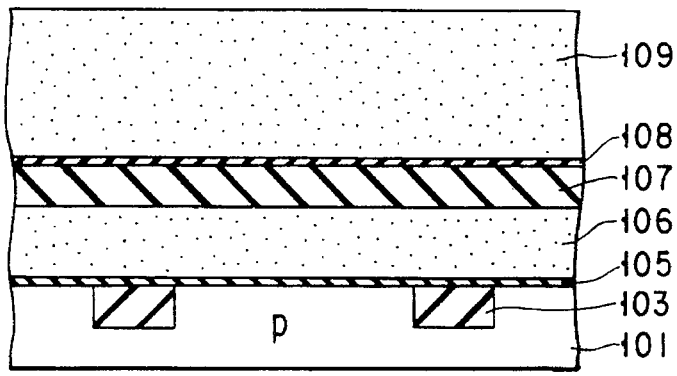
Figure 17A:
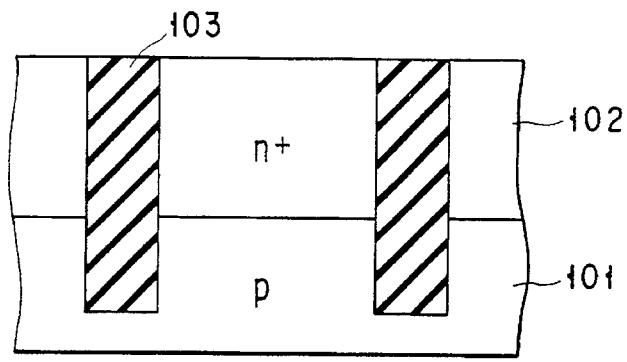
Figure 17B:
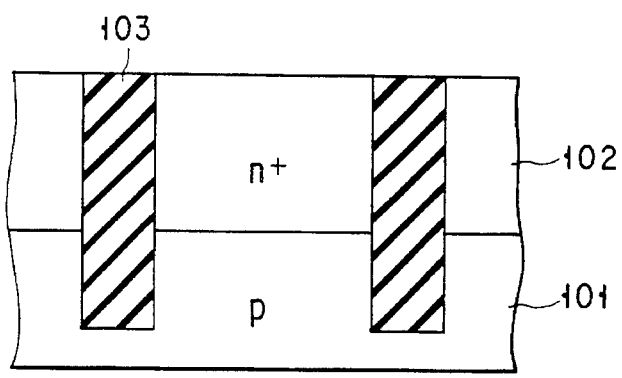
Figure 17C:
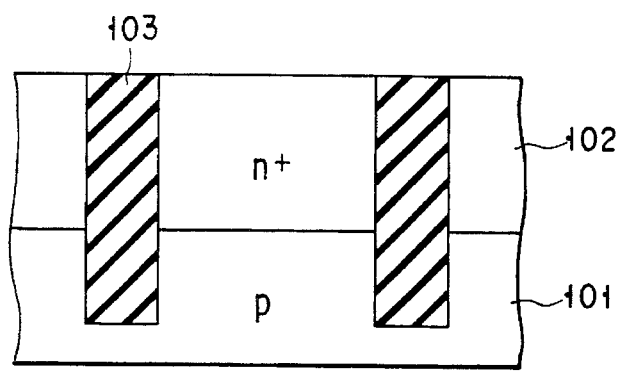
Figure 17D:
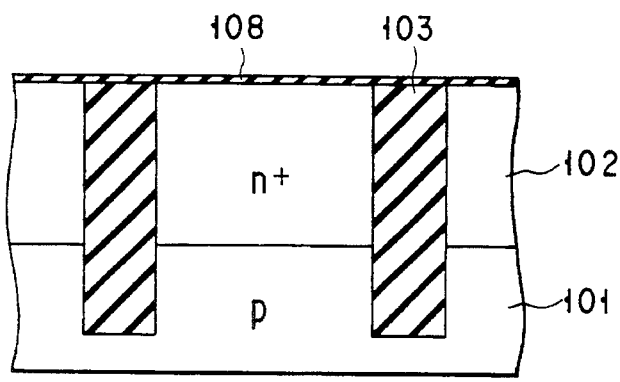
Figure 18A:
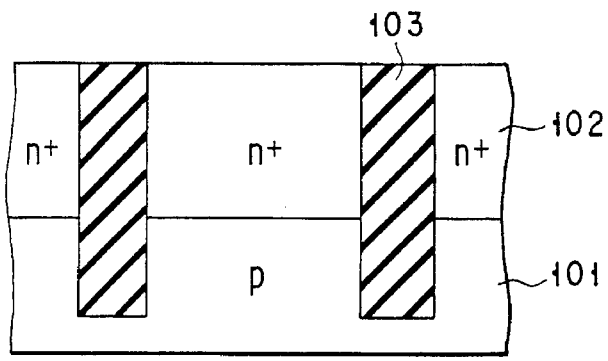
Figure 18B:
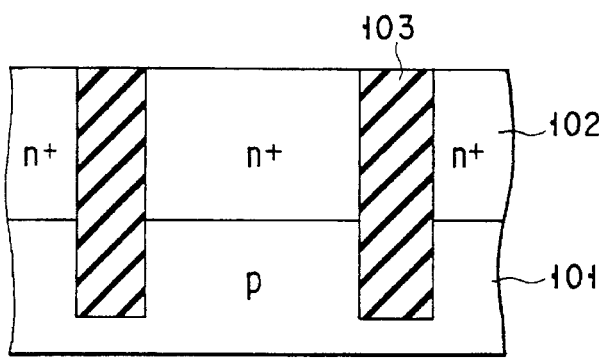
Figure 18C:
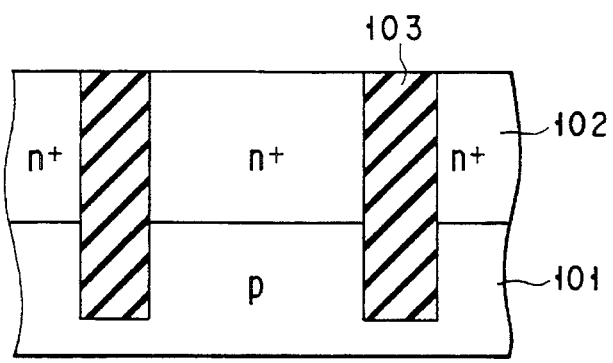
Figure 18D:
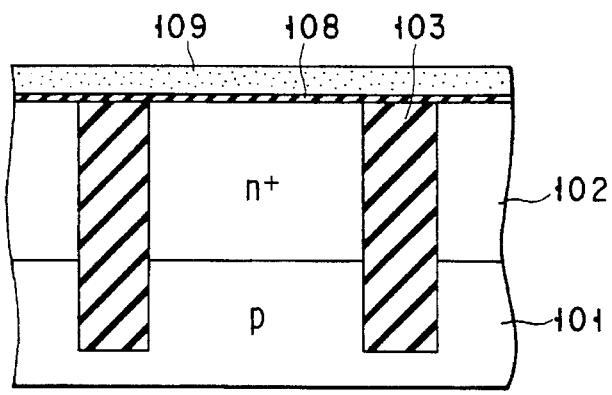

FIG. 12 and FIGS. 13A to 13D collectively show the memory cell structure a NAND type DRAM according to a sixth embodiment of this invention. FIG. 12 is a plan view of the DRAM, FIG. 13A is a cross sectional view taken along the line XIIIA—XIIIA of FIG. 12, FIG. 13B is a cross sectional view taken along the line XIIIB—XIIIB of FIG. 12, FIG. 13C is a cross sectional view taken along the line XIIIC—XIIIC of FIG. 12, and FIG. 13D is a cross sectional view taken along the line XIIID—XIIID of FIG. 12.

In this embodiment, element isolation regions 103 are linearly formed in a direction perpendicular to the word line on a p-type silicon substrate 101. Further, linear gate trenches 104 are formed by simultaneously etching the p-type silicon substrate 101 and element isolation regions 103. On the bottom portion of the gate trench 104, a word line (gate electrode) 106 is formed with a gate insulation film 105 disposed therebetween and the word line 106 is completely buried in the gate trench 104. Further, a capacitor insulation film 108 and plate electrode 109 are formed over the word line 106 with an insulation film 107 for isolation disposed therebetween. That is, in the memory cell, the capacitor is formed in a position higher than the gate electrode 106 in the trench 104. In this case, the storage electrode is an n-type diffusion layer 102 on the p-type silicon substrate 101, the n-type diffusion layer 102 being also used as the source/drain region of the MOS transistor.

As shown in the drawing, in this embodiment, when the plate electrode 109 has been just formed, the surface configuration is flat to provide a structure which is free from a step difference. Therefore, bit lines are able to be formed on a flat surface free from a step difference. Further, it is also an important feature that the storage electrode contact is not necessary.

FIGS. 14A to 18D show the manufacturing process for the DRAM according to the sixth embodiment. FIGS. 14A to 14D are plan views corresponding to FIG. 12, FIGS. 15A to 15D are cross sectional view corresponding to FIG. 13A, FIGS. 16A to 16D are cross sectional view corresponding to FIG. 13B, FIGS. 17A to 17D are cross sectional views corresponding to FIG. 13C, FIGS. 18A to 18D are cross sectional views corresponding to FIG. 13D. FIGS. 15A, 16A, 17A and 18A show the same step. FIGS. 15B, 16B, 17B and 18B show the same step. FIGS. 15C, 16C, 16C and 18C show the same step. FIGS. 15D, 16D, 17D and 18D show the same step.

As shown in FIGS. 15A, 16A, 17A and 18A, trench isolation regions 103 are formed in a direction perpendicular to the word line direction after an n-type diffusion layer 102 is formed on a p-type silicon substrate 101. The diffusion layer 102 can be formed by ion-implantation and a succeeding annealing process. Alternatively, it may be formed as an n-type epitaxial layer on the p-type silicon substrate 101 or by use of another method. Further, it may be formed at the same time as formation of an n well for a peripheral circuit.

Next, as shown in FIGS. 15B, 16B, 17B and 18B, a gate forming trench 104 for burying the word line is formed. It is important to note that the depth of the gate trench 104 is larger than that of the n-type diffusion layer 102 and that not only the silicon substrate 101 but also the insulation film in the element isolation trench 103 are simultaneously etched. In this embodiment, the etching rates of the substrate 101 and the element isolation insulation film 103 are set to the same value, but they are not necessarily set to the same value. However, in either case, it is preferable to set the depth of the gate trench 104 smaller than the depth of the trench isolation region 103. Otherwise, satisfactory element isolation in the word line direction cannot be attained.

Next, as shown in FIGS. 15C, 16C, 17C and 18C, phosphorus doped polysilicon is deposited after a gate insulation film 105 is formed, and then, it is etched back to form gate electrodes (word lines) 106 on the bottom portions of the gate trenches 104. After this, an insulation film such as a silicon oxide film is formed by the CVD method and then it is etched back to bury insulation film 107 on the respective gate electrodes 106. Due to the insulation film 107, the capacitance between the gate electrode 106 and a plate electrode to be formed later is reduced. In addition, a short circuit between the plate electrode and the gate electrode 107 is prevented by the insulation film 107.

Next, as shown in FIGS. 15D, 16D, 17D and 18D, a capacitor insulation film 108 such as an NO (nitride-oxide) film is formed, and then a plate electrode 109 of phosphorus doped polysilicon, for example, is formed. After this, an inter-level insulation film 110 is formed, contact holes for bit line contacts are formed and bit lines 112 are formed to complete the DRAM memory cell structure shown in FIG. 12 and FIGS. 13A to 13D.

A ferroelectric film of PZT, strontium titanate, barium titanate or the like may be formed as the capacitor insulation film after formation of the gate electrode 106. In this case, in order to alleviate the stress of the ferroelectric film and metal storage electrode of metal plate electrode to the substrate, it is preferable to use a-Si deposited on the silicon substrate surface as the storage electrode or a buffer layer of the storage electrode. In this embodiment wherein the word line is buried in the lower position and the capacitor is formed thereon, unlike the type having the reversed structure, formation of transistors requiring heat treatment is effected at an early stage so that the ferroelectric film having poor resistance to heat can be easily used.

[Embodiment 7]

In the sixth embodiment described above, for example, only two of the four side surfaces of a silicon column surrounded by the two gate trenches 103, 104 are used to form the capacitor. In contrast, in this embodiment, all of the four side surfaces of the silicon column are used for formation of the capacitor.

The basic structure of this embodiment is the same as the structure shown in FIG. 12 and FIGS. 13A to 13D, but the cross sections taken along the lines XIIIC—XIIIC and XIIID—XIIID of FIG. 12 are different. That is, the cross section taken along the line XIIIC—XIIIC of FIG. 12 does not correspond to FIG. 13C but corresponds to FIG. 19A. Further, the cross section taken along the line XIIID—XIIID of FIG. 12 does not correspond to 10 FIG. 13D but corresponds to FIG. 19B.

The above structure can be easily attained by slightly modifying the manufacturing process of the sixth embodiment shown in FIGS. 14A to 18D. That is, when the structure shown in FIGS. 15A, 16A, 17A and 18A is formed, the process may be changed to obtain the cross section shown in FIG. 20 instead of the cross section of FIGS. 17A and 18A. For example, the structure of FIG. 20 can be easily obtained by overetching the buried insulation film of the trench isolation region 103 to etch out part of the insulation film. Alternatively, etching-out of the insulation film 103 may be attained by overetching effected at the time of formation of the polysilicon gate electrode 106 or overetching effected at the time of burying the insulation film 107 on the gate electrode 106.

[Embodiment 8]

Figure 21:
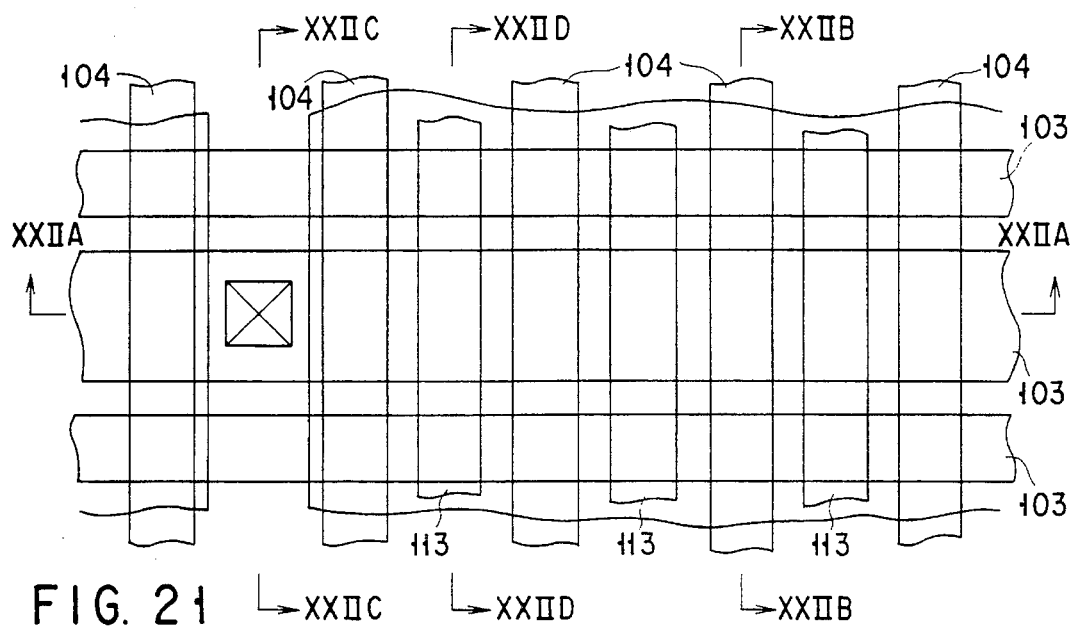
FIG. 21 is a plan view showing the construction of the memory cell structure of a DRAM according to an eighth embodiment of this invention.
Figure 22A:
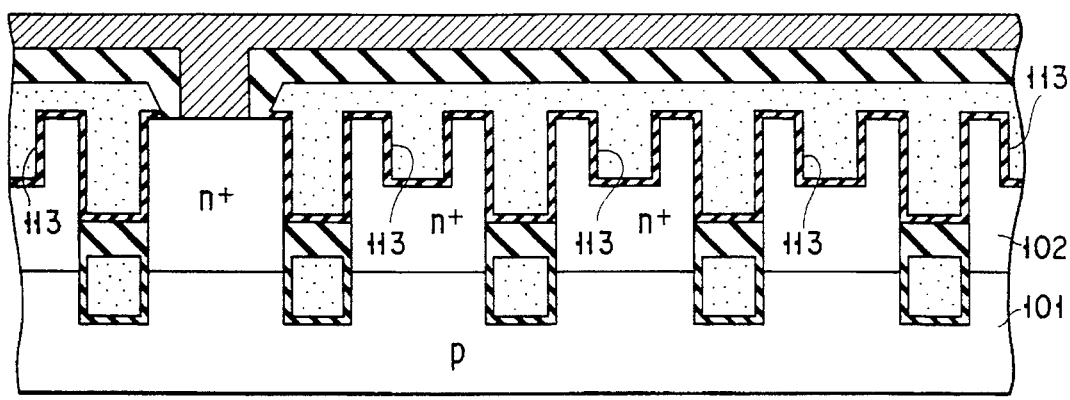
FIGS. 22A, 22B, 22C and 22D are cross sectional views respectively taken along the lines XXIIA—XXIIA, XXIIB—XXIIB, XXIIC—XXIIC and XXIID—XXIID of FIG. 21.
Figure 22B:
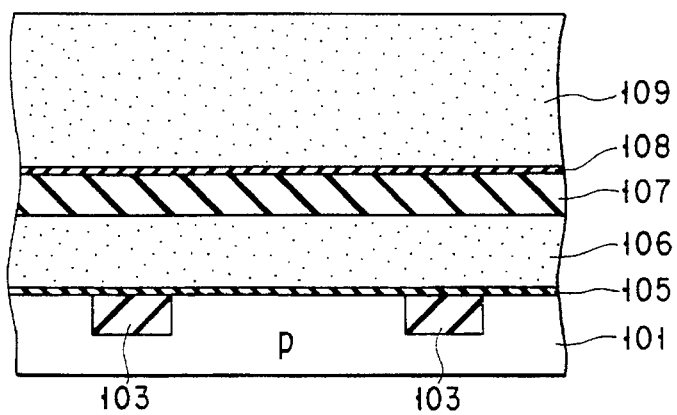
Figure 22C:
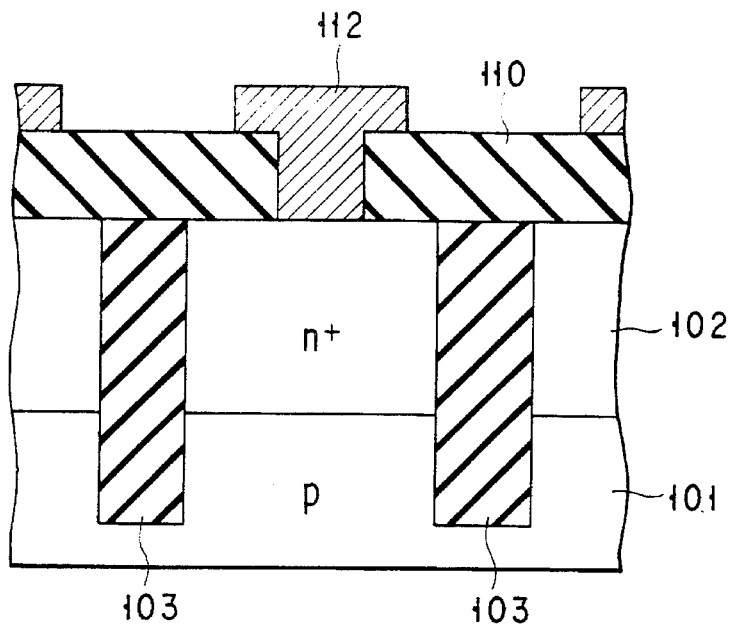
Figure 22D:
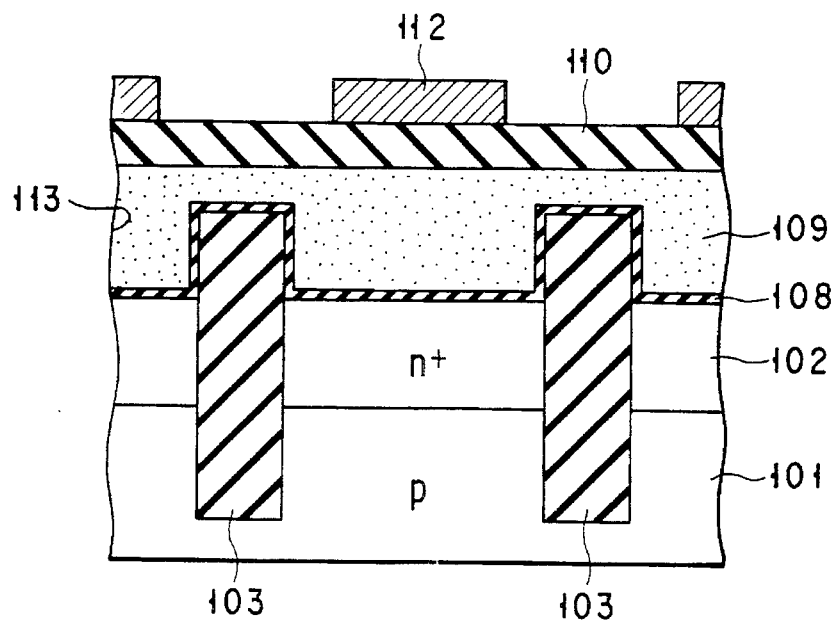

FIGS. 21 and FIGS. 22A to 22D show the structure of the memory cell of a DRAM according to an eighth embodiment of this invention. FIG. 21 is a plan view, FIG. 22A is a cross sectional view taken along the lines XXIIA—XXIIA of FIG. 21, FIG. 22B is a cross sectional view taken along the lines XXIIB—XXIIB of FIG. 21, FIG. 22C is a cross sectional view taken along the lines XXIIC—XXIIC of FIG. 21, and FIG. 22D is a cross sectional view taken along the line XXIID—XXIID of FIG. 21.

Also, in this embodiment, the structure which is basically the same as that of the sixth embodiment is used and a new structure for increasing $C_S$ of the capacitor is used. In this embodiment, a second trench 113 is formed by selectively etching the n-type diffusion layer 102 used as the storage electrode after the gate electrode (word line) 106 is formed. Then, $C_S$ is increased by forming the capacitor along the surface of the second trench 113 as well as gate trench.

In this embodiment, the second trench 113 is formed in a linear pattern, but the pattern form of the second trench 113 is not limited to a particular form. Therefore, a second trench 113 having various pattern forms such as a circular pattern can be formed.

[Embodiment 9]

Figure 23:
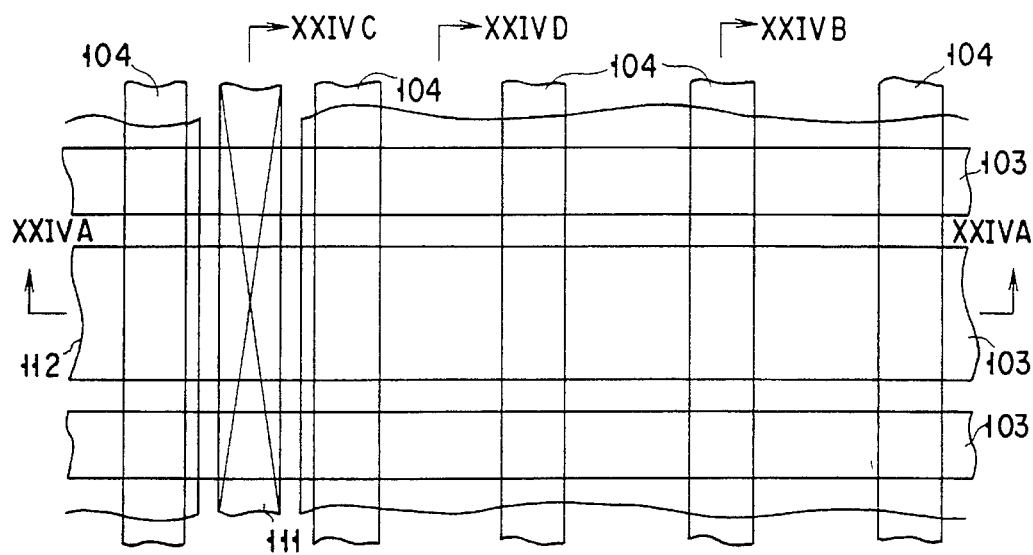
FIG. 23 is plan view showing the construction of the memory cell structure of a DRAM according to a ninth embodiment of this invention.
Figure 24A:
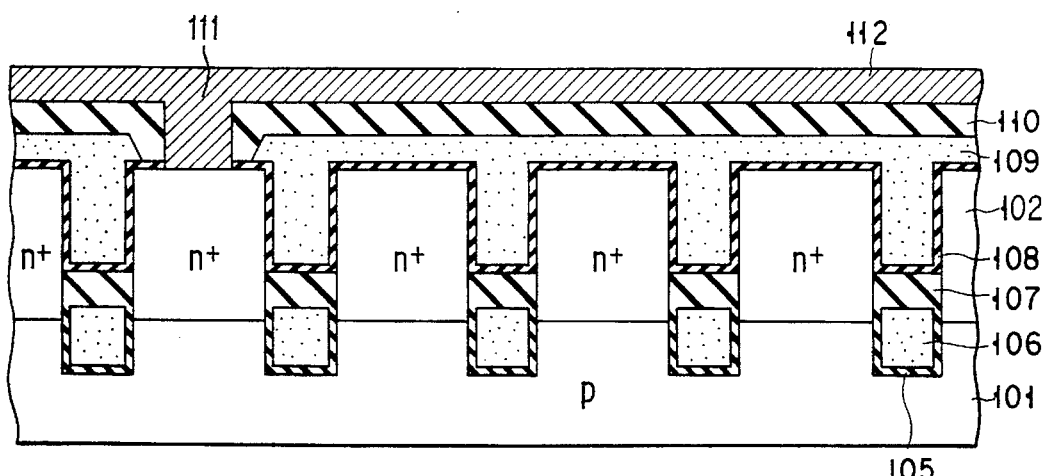
FIGS. 24A, 24B, 24C and 24D are cross sectional views respectively taken along the lines XXIVA—XXIVA, XXIVB—XXIVB, XXIVC—XXIVC and XXIVD—XXIVD of FIG. 23.
Figure 24B:
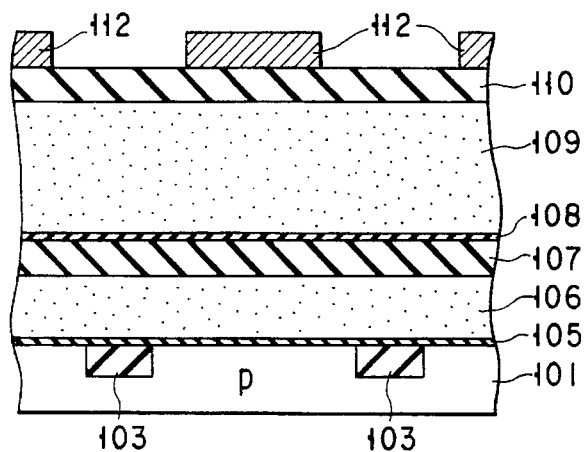
Figure 24C:
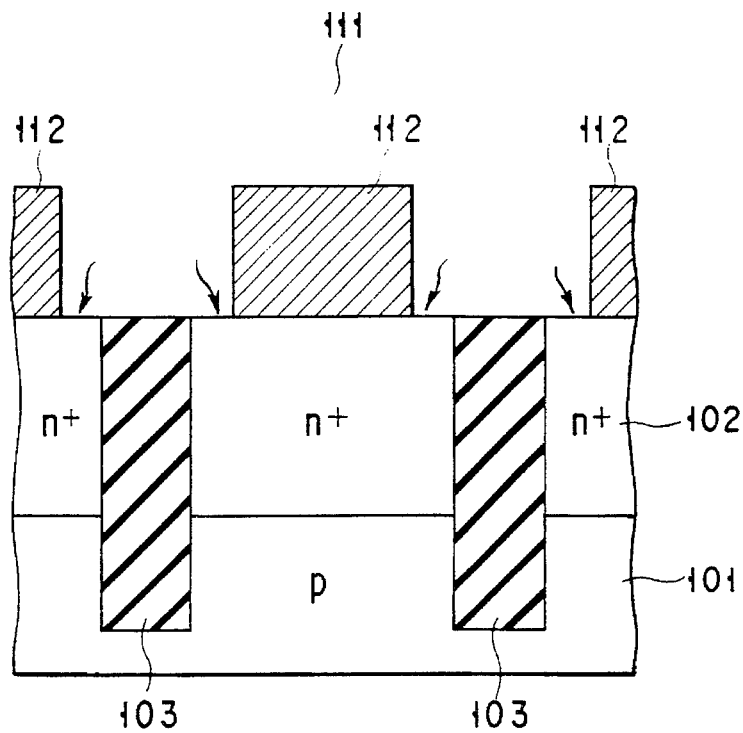
Figure 24D:
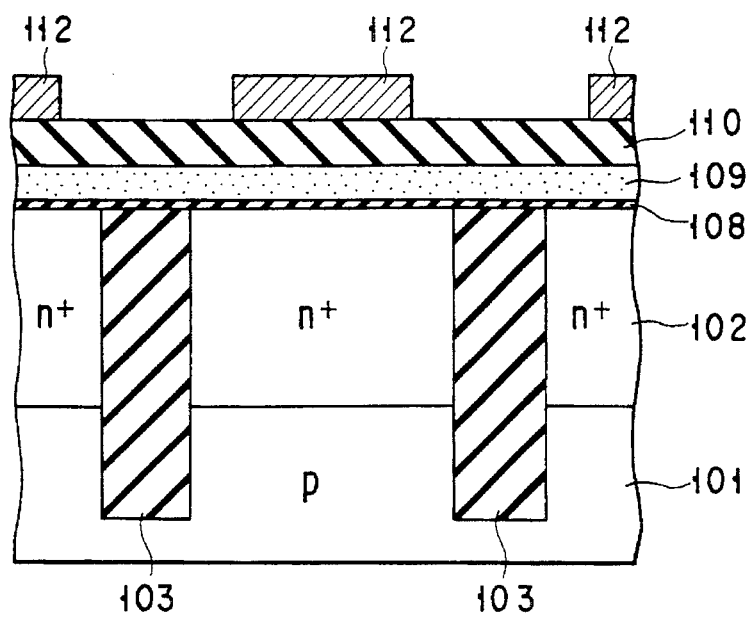

FIGS. 23 and FIGS. 24A to 24D show the memory cell structure of a DRAM according to a ninth embodiment of this invention. FIG. 23 is a plan view of the DRAM, FIG. 24A is a cross sectional view taken along the line XXIVA—XXIVA of FIG. 23, FIG. 24B is a cross sectional view taken along the line XXIVB—XXIVB of FIG. 23, FIG. 24C is a cross sectional view taken along the line XXIVC—XXIVC of FIG. 23, and FIG. 24D is a cross sectional view taken along the line XXIVD—XXIVD of FIG. 23.

As is clearly shown in FIG. 23, this embodiment has a feature that the pattern of a bit line contact 111 is formed in a linear form. Owing to this feature, the memory cell structure is constructed by linear patterns only, and this is extremely important for miniaturization. The reason is that miniaturization of the conventional contact hole pattern is more difficult than miniaturization of the linear pattern when the normal lithography technique is used. Specifically, in the case of a linear pattern, it is possible to easily form a minute pattern having higher resolution than that determined by the wavelength of light by applying the phase shifting technique on the photo stopper, for example. In contrast, in the case of a contact pattern, the effect of the phase shifting technique is small because of its deteriorated resolution. Therefore, in the DRAM constructed by use of only the linear pattern as in this embodiment, miniaturization of the contact pattern is not limited by the light wavelength employed in the lithography so that a further miniaturized DRAM can be manufactured.

In the case of this embodiment, when the contact hole of a linear pattern is formed, portions of the n-type diffusion layer 102 indicated by arrows in FIG. 24C are overetched. In the structure of this embodiment, however, since a junction between the n-type diffusion layer 102 and the p-type substrate 101 is formed in the deep position, there is no possibility that deterioration in the characteristic such as an increase in the junction leak is caused by the overetching.

[Embodiment 10]

Figure 25:
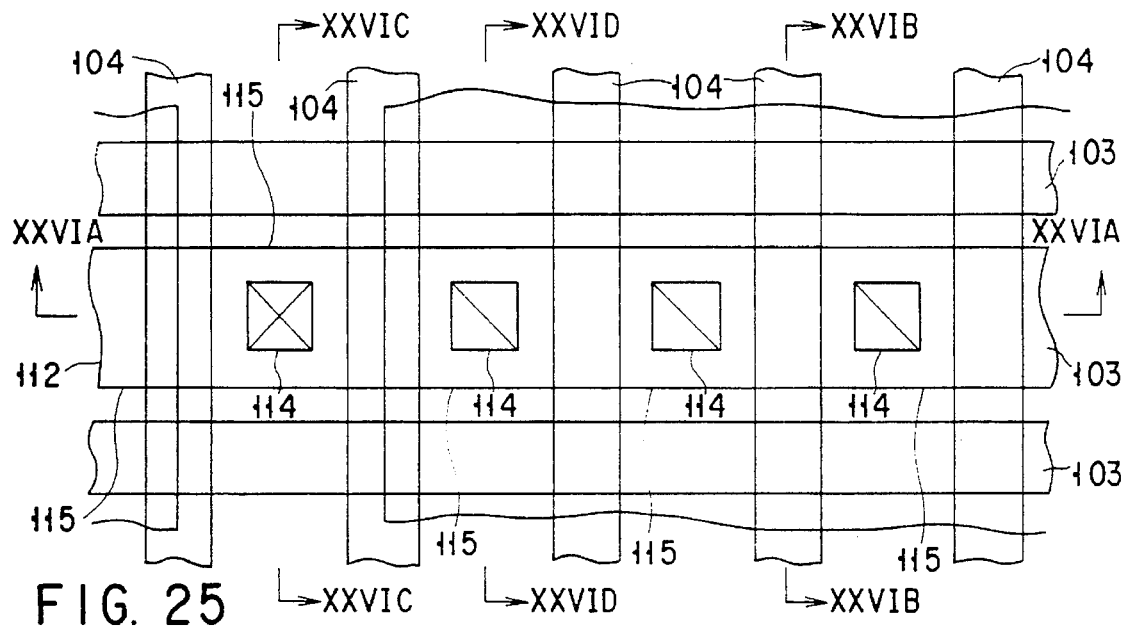
FIG. 25 is a plan view showing the construction of the memory cell structure of a DRAM according to a tenth embodiment of this invention.
Figure 26A:
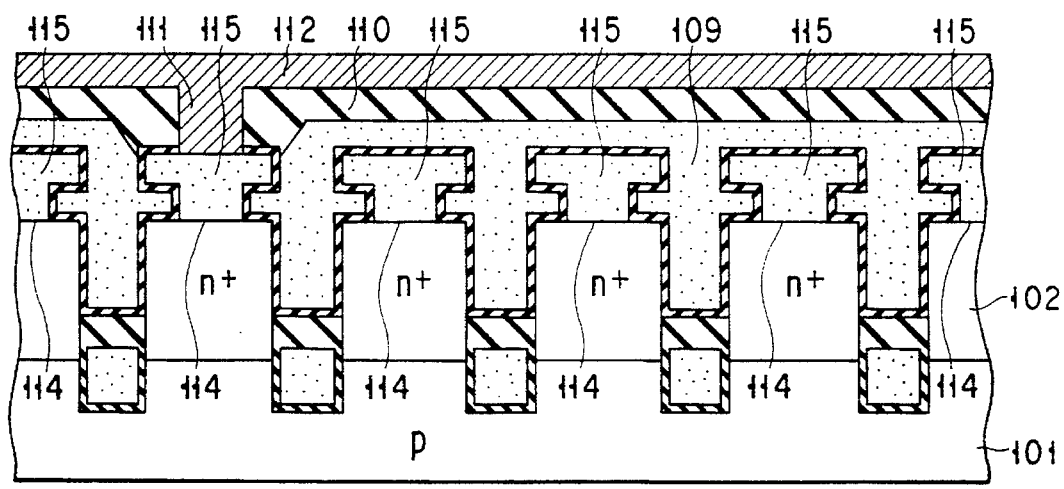
FIGS. 26A, 26B, 26C and 26D are cross sectional views respectively taken along the lines XXVIA—XXVIA, XXVIB—XXVIB, XXVIC—XXVIC and XXVID—XXVID of FIG. 25.
Figure 26B:
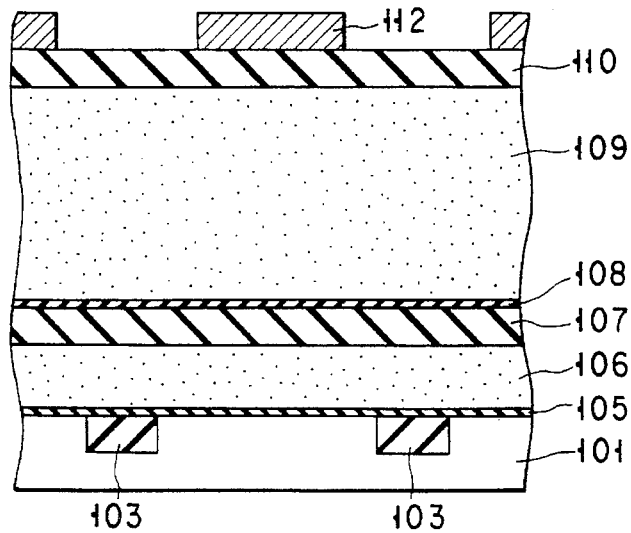
Figure 26C:
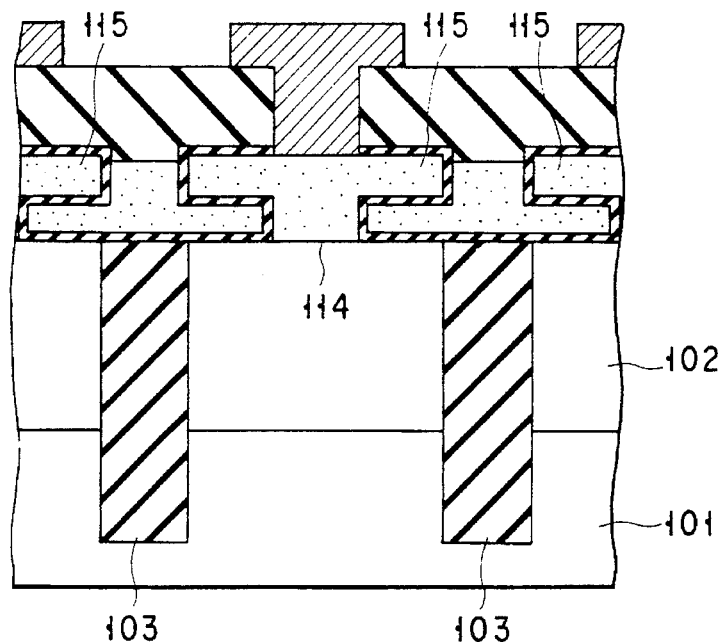
Figure 26D:
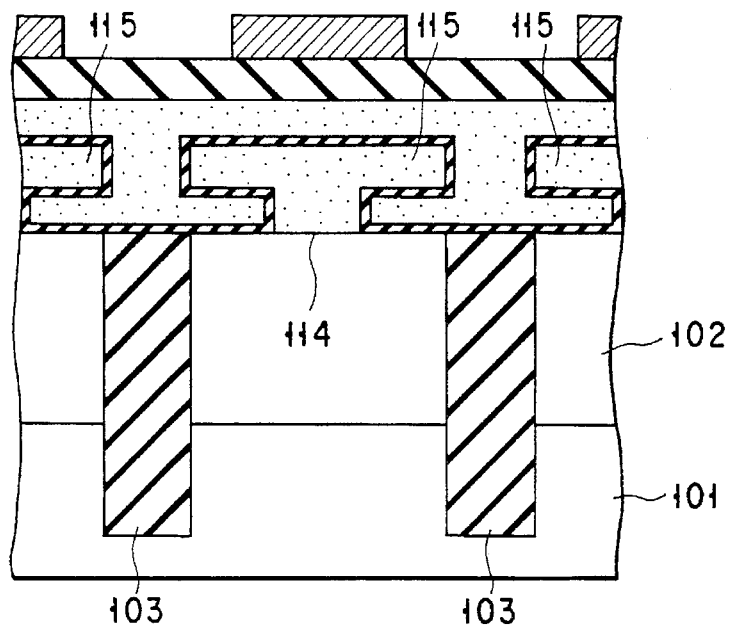

FIGS. 25 and FIGS. 26A to 26D show the structure of the memory cell structure of a DRAM according to a tenth embodiment of this invention. FIG. 25 is a plan view of the DRAM, FIG. 26A is a cross sectional view taken along the line XXVIA—XXVIA of FIG. 25, FIG. 26B is a cross sectional view taken along the line XXVIB—XXVIB of FIG. 25, FIG. 26C is a cross sectional view taken along the line XXVIC—XXVIC of FIG. 25, and FIG. 26D is a cross sectional view taken along the line XXVID-XXVID of FIG. 25.

Also, in this embodiment, a new structure for increasing $C_S$ of the capacitor is used. That is, a new stacked type storage electrode 115 is formed on the flat surface of the n-type diffusion layer 102 used as a storage electrode. The storage electrode 115 is formed in contact with the n-type diffusion layer 102 via the contact 114.

[Embodiment 11]

Figure 27:
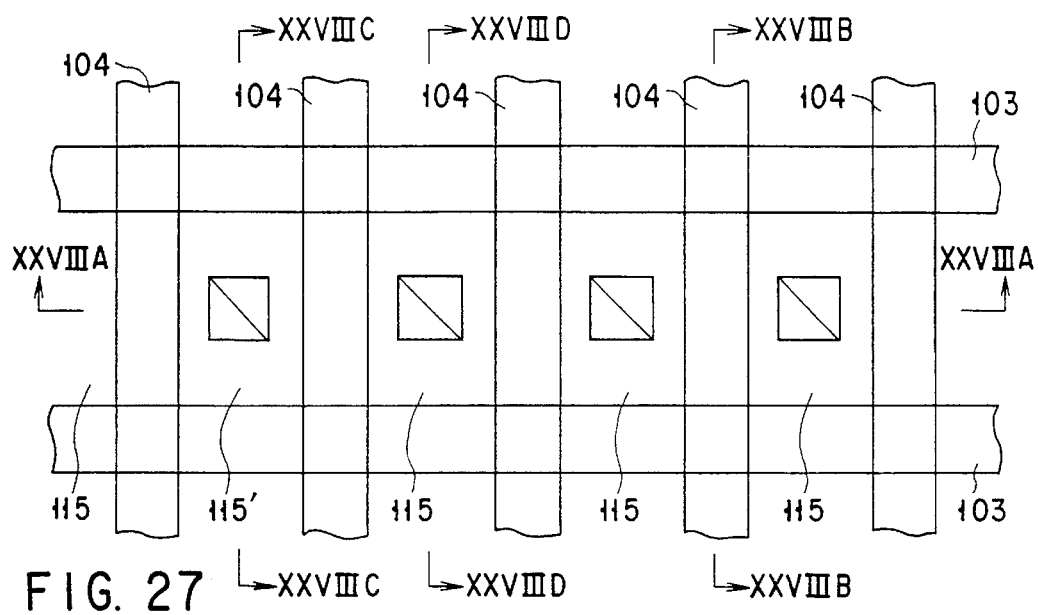
Figure 28A:
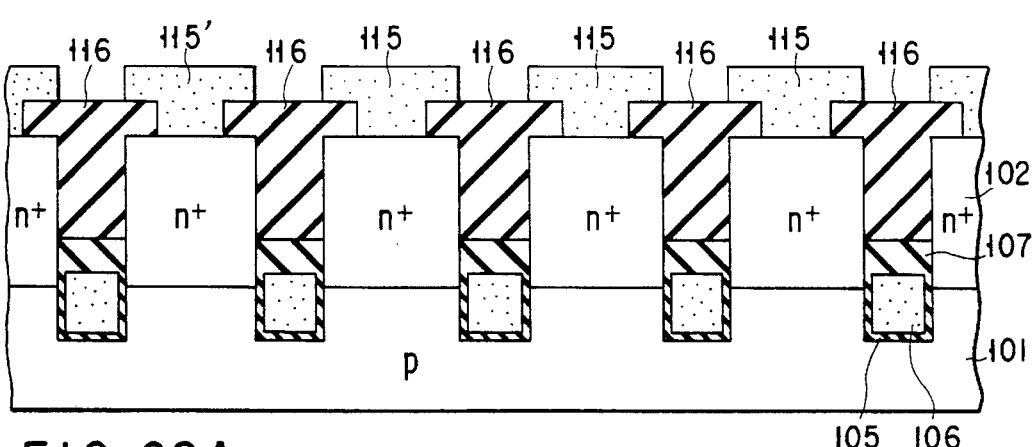
Figure 28B:
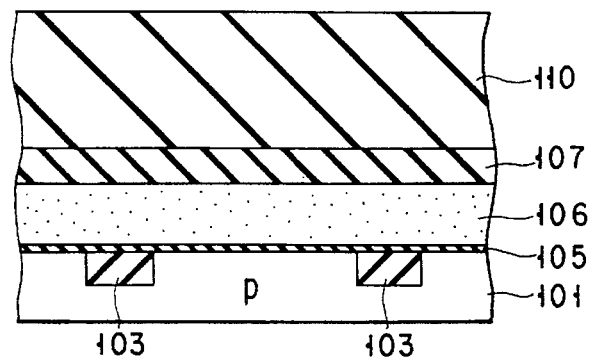
Figure 28C:
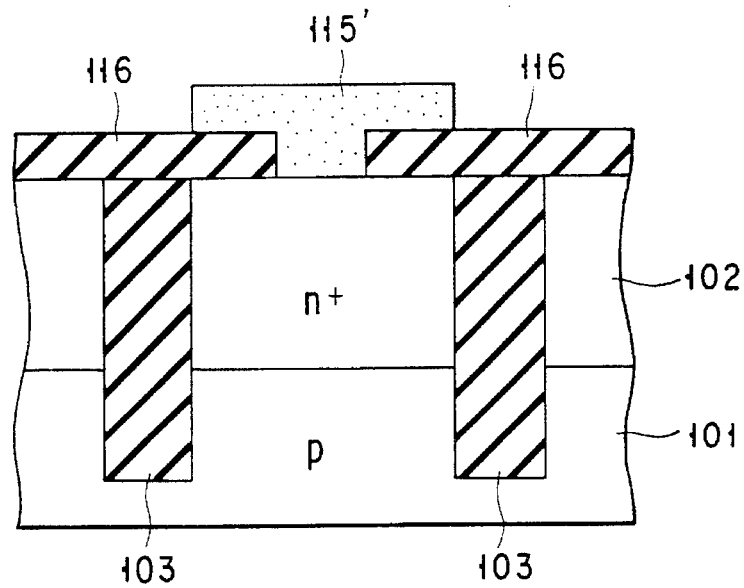
Figure 28D:
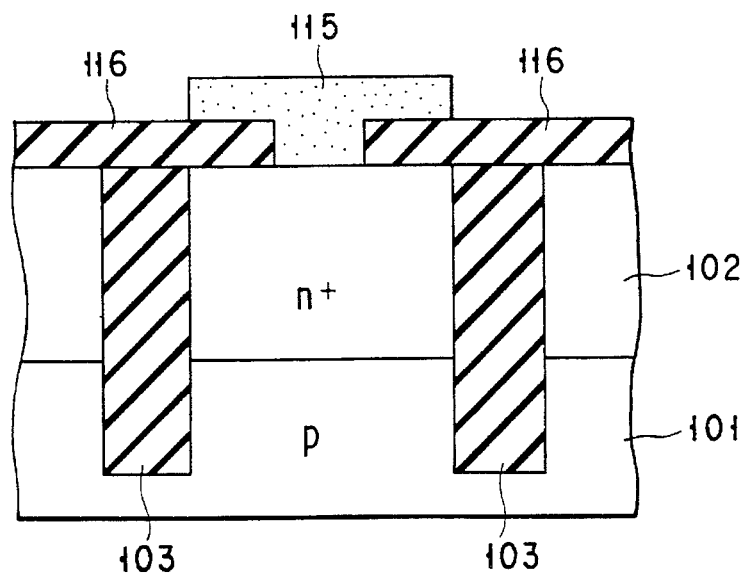
Figure 29:
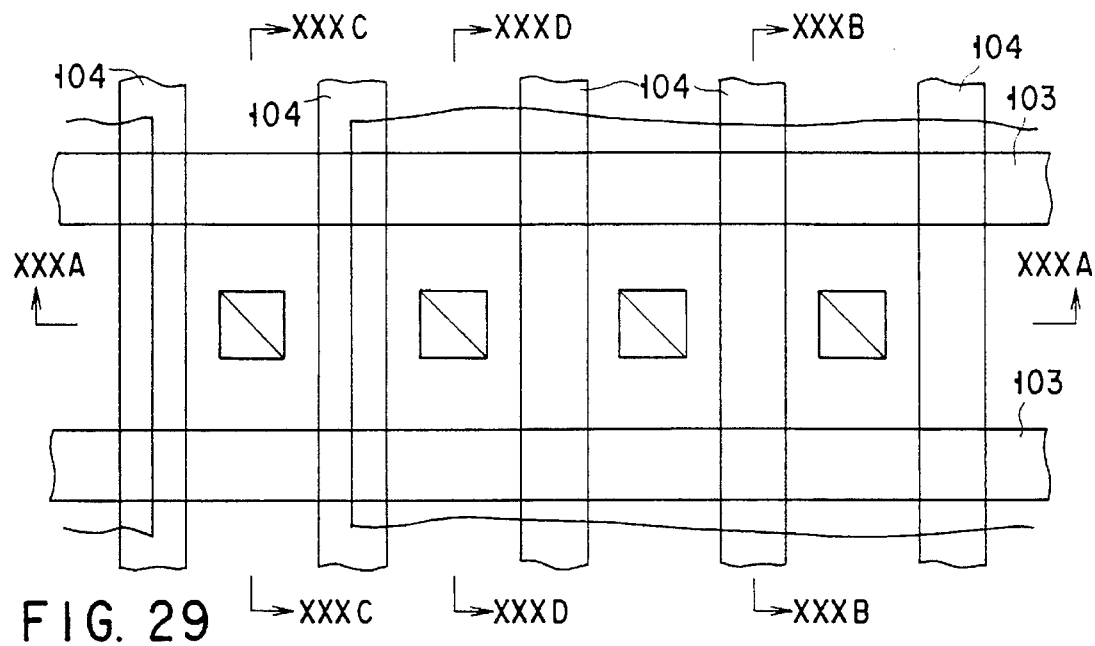
Figure 30A:
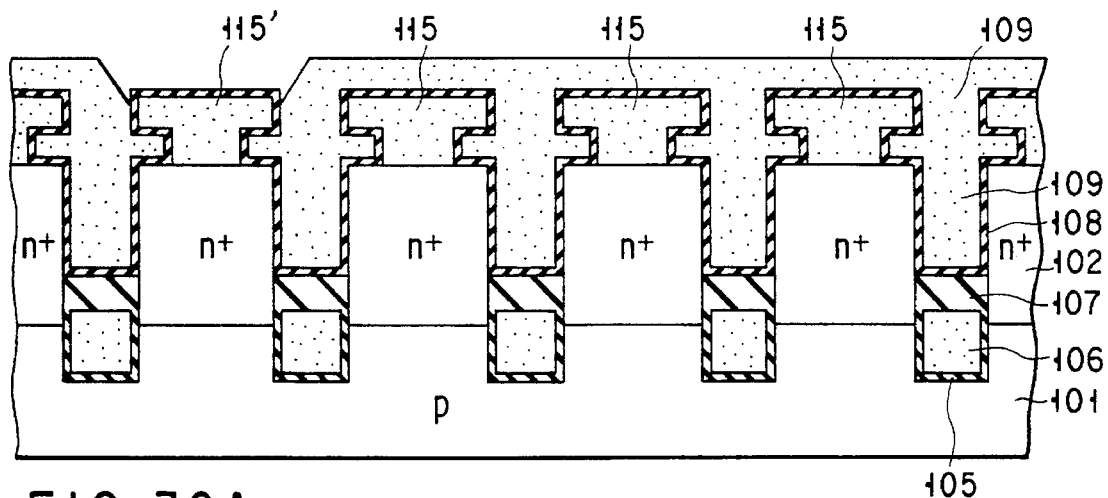
Figure 30B:
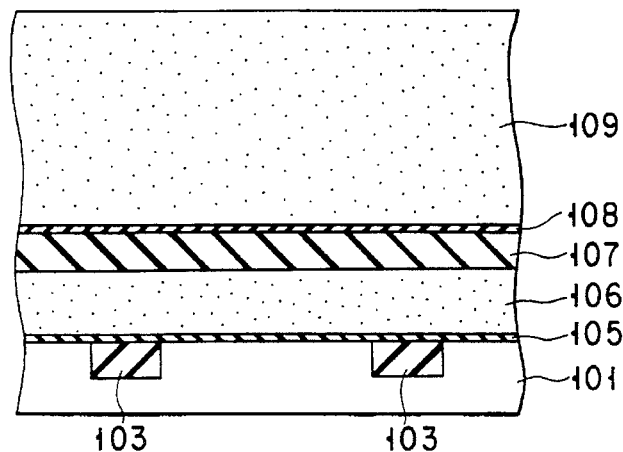

FIGS. 27 and FIGS. 28A to 28D together with FIG. 29 and FIGS. 30A to 30D are views for illustrating the main steps in the process for manufacturing a DRAM memory cell structure according to the tenth embodiment shown in FIGS. 25 and 26. FIGS. 27 and FIGS. 28A to 28D collectively show the structure obtained immediately before a plate electrode 109 is formed and FIGS. 29 and FIGS. 30A to 30D collectively show the structure obtained after the plate electrode 109 is formed. FIG. 27 is a plan view of a DRAM, FIG. 28A is a cross sectional view taken along the line XXVIIIA—XXVIIIA of FIG. 27, FIG. 28B is a cross sectional view taken along the line XXVIIIB—XXVIIIB of FIG. 27, FIG. 28C is a cross sectional view taken along the line XXVIIIC—XXVIIIC of FIG. 27, and FIG. 28D is a cross sectional view taken along the line XXVIIID—XXVIIID of FIG. 27. Likewise, FIG. 29 is a plan view of the DRAM, FIG. 30A is a cross sectional view taken along the line XXXA—XXXA of FIG. 29, FIG. 30B is a cross sectional view taken along the line XXXB—XXXB of FIG. 29, FIG. 30C is a cross sectional view taken along the line XXXC—XXXC of FIG. 29, and FIG. 30D is a cross sectional view taken along the line XXXD—XXXD of FIG. 29.

First, the process up to the step of forming the gate electrode 106 is effected in the same manner as in the manufacturing process of the sixth embodiment as already explained with reference to FIGS. 14A to 18D and then an insulation film 107 is buried. At this time, if the surface portion of the insulation film 107 is formed of a silicon nitride film, the silicon nitride film can be used as an etching stopper in the later etching process. After this, an inter-level insulation film 116 formed of silicon oxide film is formed by the CVD method and then a stacked type storage electrode 115 and pad layer 115' are formed.

Of course, it is possible to form a capacitor immediately after the step described above so as to form a normal stacked type capacitor. However, in this example, the inter-level insulation film (silicon oxide film) 116 is removed by use of $NH_4F$ solution in order to form a capacitor also in the gate trench 104. In this etching step, if the insulation films 103, 107 are formed of silicon nitride, it is possible to selectively remove only the inter-level insulation film 116. Otherwise, any stopper film may be formed. Thereafter, a capacitor insulation film 108 and plate electrode 109 are formed to construct the structure shown in FIGS. 29 and FIGS. 30A to 30D.

In this embodiment, when the storage electrode 115 is patterned, the pad layer 115' made of the same polysilicon layer is simultaneously formed in the bit line contact area. However, the pad layer 115' is not necessarily formed. Finally, an inter-level layer 110, bit line contacts 111, and bit lines 112 are formed so as to construct the DRAM memory cell structure of the tenth embodiment shown in FIG. 25 and FIGS. 26A to 26D.

In this embodiment, the bit line 112 is formed after the capacitor is formed. However, it is also possible to first form the bit line 112 and then form the capacitor. In this case, it becomes difficult to use, in order to form a capacitor, the internal portion of the gate trench 104 in which the word line 106 is buried.

As described above, according to the sixth to eleventh embodiments, the storage capacitance of the capacitor can be made sufficiently large without increasing the step difference of the structure on which upper-level wirings such as bit lines are formed. At the same time, the integration density can be enhanced without reducing the substantial gate length of the transfer gate. Therefore, a semiconductor memory device capable of attaining the improvement of cut-off characteristic, enhanced reliability and high integration density can be obtained. Further, the embodiments are not limited to the NAND type DRAM, but can be applied to a NOR type DRAM.

[Embodiment 12]

Figure 31A:
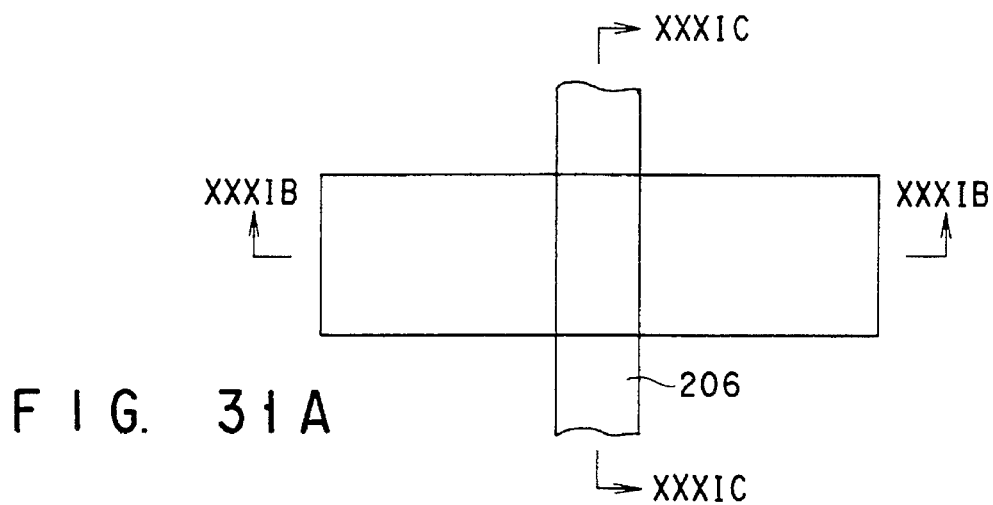
FIG. 31A is a plan view showing the element structure of a transistor according to the twelfth embodiment of this invention and FIGS. 31B and 31C are cross sectional views respectively taken along the lines XXXIB—XXXIB and XXXIC—XXXIC of FIG. 31A.
Figure 31B:
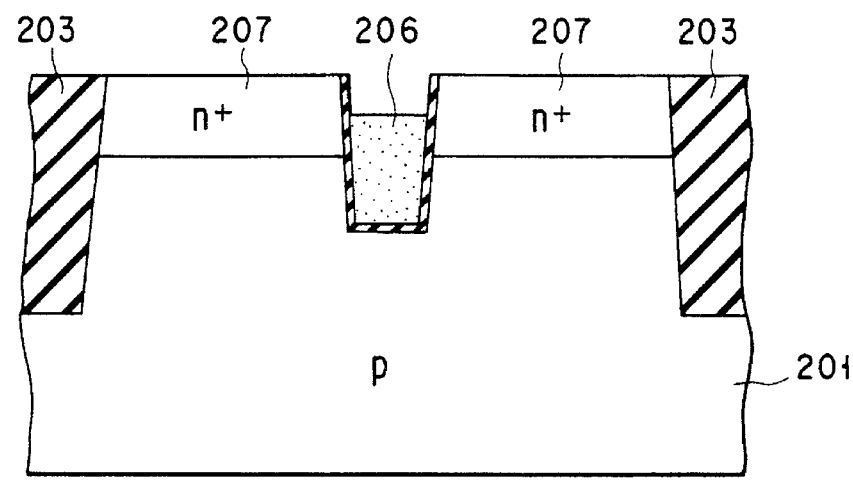
Figure 31C:
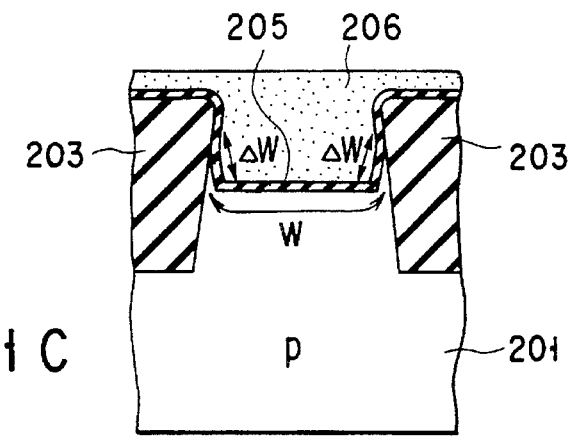

FIG. 31A is a plan view showing the element structure of a transistor according to a twelfth embodiment of this invention. FIGS. 31B and 31C are cross sectional views taken along the lines XXXIB—XXXIB and XXXIC—XXXIC of FIG. 31A. In the drawing, 201 denotes a p-type silicon substrate, 203 an element isolation insulation film, 205 a gate insulation film, 206 a gate electrode, and 207 an n-type source/drain region.

In this embodiment, the structure having the increased effective channel width is employed in order to enhance the driving ability of a concave type MOS transistor which has the gate electrode 206 completely buried. That is, in this embodiment, the side wall of the isolation trench in which the element isolation insulation 203 is buried and the side wall of the gate trench in which the gate electrode 206 is buried are forwardly tapered. With this structure, a silicon substrate region between the side surface of the isolation trench 203 and the side surface of the gate trench 206 can be used as part of the channel (which is hereinafter referred to as a side wall channel region) as shown in FIG. 31C. As shown in the figure, the bottom of the gate electrode has a length W. The part of the side wall which is separated from the isolation trench has a length $\Delta W$ on each side. Therefore, the effective channel width $\Delta W$ of the MOS transistor is increased by the width $\Delta W$ of each side wall channel region as shown in FIG. 31C and the driving ability of the MOS transistor can be to make the total effective channel width $W+2\Delta W$ enhanced by a corresponding amount. The same effect can be attained in each of the devices of the first to eleventh embodiments. Furthermore, the same effect can also be attained in a normal concave type MOS transistor in which the gate electrode is not completely buried.

[Embodiment 13]

FIGS. 32A to 32C is a view showing the element structure of a transistor according to a thirteenth embodiment of this invention. FIG. 31A is a plan view, and FIGS. 32B and 32C are cross sectional views taken along the lines XXXIIB—XXXIIB and XXXIIC—XXXIIC of FIG. 32A.

Like the embodiment of FIGS. 31A to 31C, in this embodiment, a structure in which the effective channel width W is increased is employed. Specifically, as shown in FIG. 32C, the effective channel width W is increased by width $2\Delta W$ of the side wall channel regions on both sides. However, since the depth $D_2$ of the side wall channel region is smaller than the depth $D_3$ of the normal channel region, a difference between the channel depth and the depth $D_1$ of the source/drain region is reduced in the side wall channel region as shown in the drawing. As a result, the effective channel length is reduced in the side wall channel region, thereby causing the structure to be easily influenced by the short channel effect. However, this problem can be solved by adjusting the depth of the gate trench.

Figure 33A:
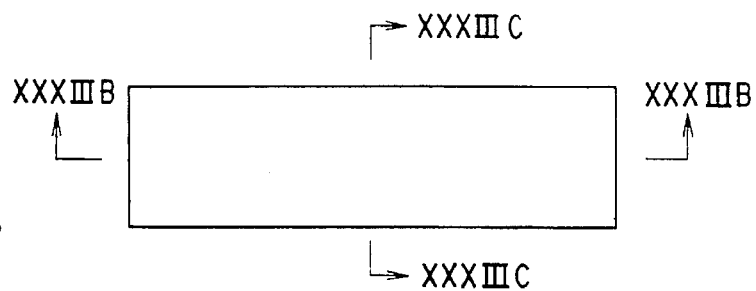
FIGS. 33A, 33B, 33C, 34A, 34B, 34C, and 35A, 35B, 35C are views and cross sectional views for illustrating the manufacturing process for the transistor of the thirtenth embodiment shown in FIGS. 32A to 32C.
Figure 33B:
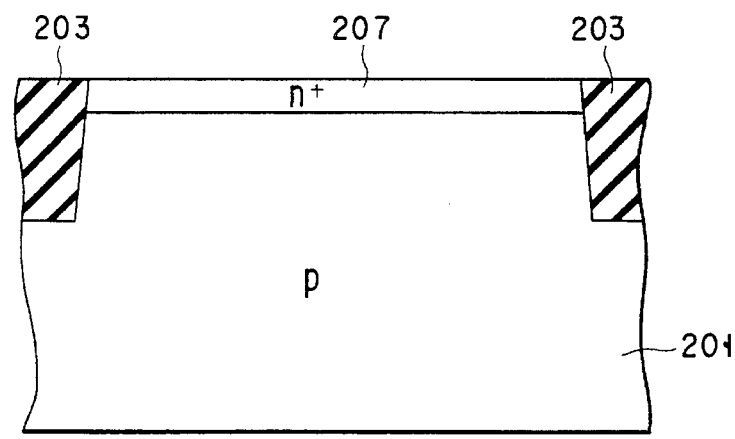
Figure 33C:
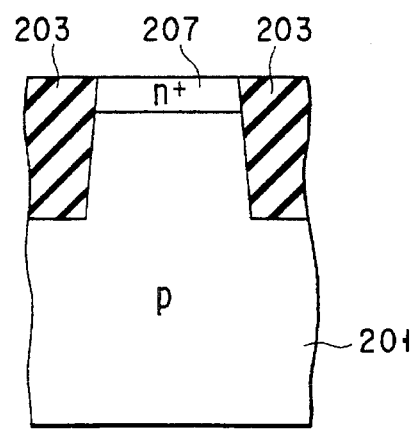
Figure 34A:
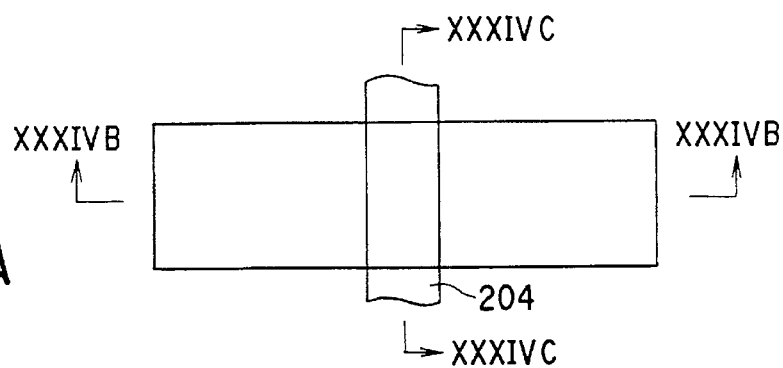
Figure 34B:
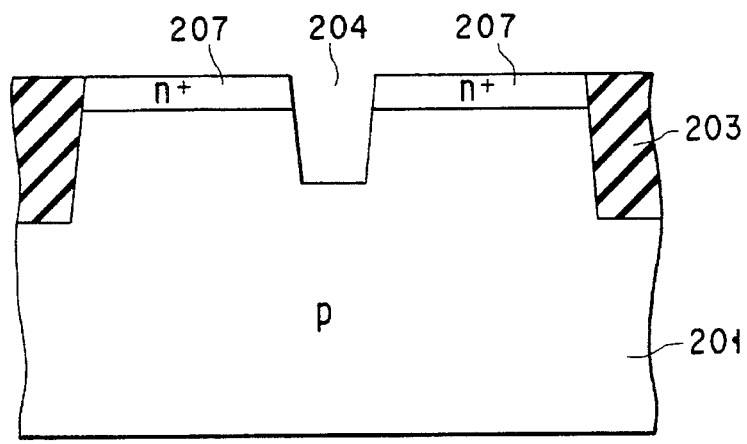
Figure 34C:
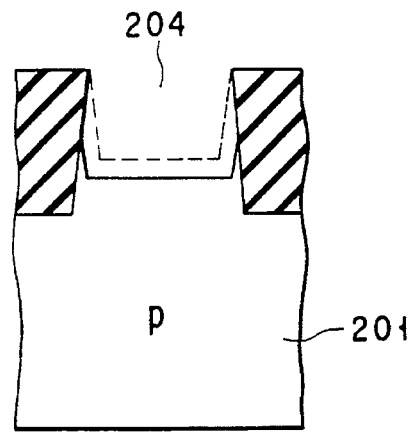
Figure 35A:
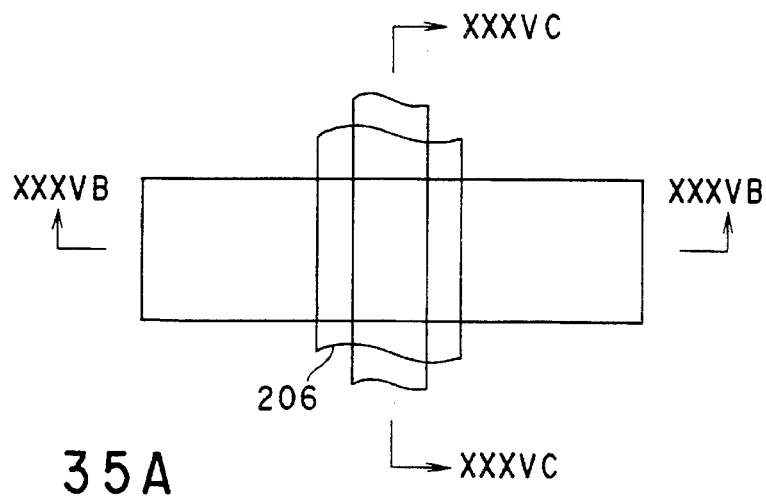
Figures 35B, 35C:
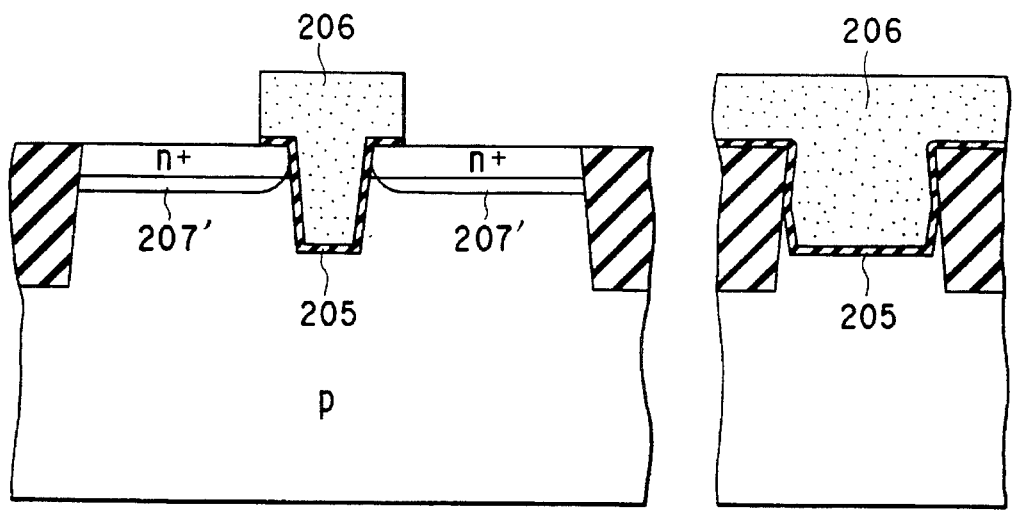

FIG. 33A to 35C are views for illustrating the manufacturing process for the transistor of the thirteenth embodiment. FIGS. 33A, 34A, 35A are plan views illustrating respective steps. FIGS. 33B, and 33C are cross-sectional views taken along the lines XXXIIIB—XXXIIIB and XXXIIIC—XXXIIIC of FIG. 33A, respectively. FIGS. 34B and 34C are cross-sectional views taken along lines XXXIVB—XXXIVB and XXXIVC—XXXIVC of FIG. 34A, respectively. FIGS. 35B and 35C are cross-sectional views taken along lines XXXVB—XXXVB and XXXVC—XXXVC of FIG. 35A, respectively.

First, as shown in FIGS. 33A to 33C, a trench isolation region 203 is formed on a p-type silicon substrate 201. In this case, after a forwardly tapered 10 trench is formed, an insulation film or the like is filled therein. The forwardly tapered form contributes to formation of the side wall channel. An $n^+$-type source/ drain diffusion layer 207 is formed before or after trench isolation is made.

Next, as shown in FIGS. 34A to 34C, a gate trench 204 is formed. The trench 204 is also formed with a forwardly tapered form. In practice, the trench 204 is formed by RIE. At this time, if the selective etching ratio with respect to the isolation insulation film 203 is significant, such a trench as shown by broken lines in FIG. 34C is formed. In this step, the side wall channel region is shallower than the source/ drain region 207. However, the trench 204 is made deeper and wider as shown by the solid lines by effecting a process for damage elimination and then further effecting an additional process if necessary. As a result, a side wall channel region deeper than the source/drain region 207 is formed.

The side wall channel region can be obtained by forming the gate trench 204 with a forwardly tapered form, so long as the etching rate of the silicon substrate 201 is set higher than that of the isolation insulation film 203 at the time of forming the gate trench 204. At this time, the shape of the side wall channel region varies depending on the tapered degree of the isolation trench 203 and gate trench 204. if both of the trenches have no tapered form, the side wall channel region is not formed. In addition, if at least one of the trenches (particularly, the isolation trench) is formed with a large reversely tapered form, the side wall channel region is not formed.

Then, as shown in FIGS. 35A to 35C, a gate insulation film 205 and gate electrode 206 are formed. Further, in this embodiment, an $n^-$-type source/drain diffusion layer 207' is formed by impurity doping with the gate electrode 206 used as mask. As a result, the LDD structure can be attained by the $n^+$-type and $n^-$-type diffusion layers 207, 207'.

Thereafter, an inter-level insulation film 208, a contact hole and wiring 210 for forming a contact 209 are formed to complete a concave MOS transistor having a side wall channel as shown in FIGS. 32A to 32C.

Thus, according to this embodiment, the driving ability can be enhanced by the presence of the side wall channel.

As specifically described above, according to the present invention, the gate electrode is completely buried in the gate trench formed in a pattern to extend over the element region and element isolation region. With this structure, a sufficiently large gate length can be attained even in a miniaturized MOS transistor, and the contact for the source/drain can be formed in self-alignment with the gate electrode and element isolation region. In addition, a MOS transistor in which the step difference is not caused by the gate electrode and a semiconductor memory device using the MOS transistor can be realized.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device, comprising:

a semiconductor substrate of a first conductivity type;

a trench type element isolation region formed in a preset depth from the semiconductor substrate surface;

an element region of the first conductivity type surrounded by the element isolation region;

a gate trench for forming a gate electrode, the gate trench being formed in the semiconductor substrate with a smaller depth than the element isolation region and extending through the element region and the element isolation region;

a gate electrode buried in the bottom portion of the gate trench via a gate insulation film;

source and drain regions of a second conductivity type formed in the element region and separated from each other by the gate trench; and a plate electrode which is buried in said gate trench and formed on said gate electrode via a capacitor insulation film, wherein at least one of said source and drain regions is used as a storage node of a capacitor;

wherein the top surface of the gate electrode lies higher than the bottom levels of the source and drain regions and lower than a contact surface of the source and drain regions.

2. The semiconductor device according to claim 1, further comprising a plate electrode which is disposed on the surface of the semiconductor substrate and above said gate electrode, said plate electrode being opposite to at least one of said source and drain regions used as a storage node of a capacitor via a capacitor insulation film.

3. The semiconductor device according to claim 1, wherein a trench for said element isolation region and said gate trench are formed so as to have forwardly tapered side walls, thereby increasing an effective channel width.

4. The semiconductor device according to claim 1, wherein the bottom surface of the gate electrode lies lower than the bottom levels of the source and drain regions.

5. A semiconductor device comprising:

a semiconductor substrate of a first conductivity type;

a trench type element isolation region formed in a preset depth from the semiconductor substrate surface;

an element region of the first conductivity type surrounded by the element isolation region;

a gate trench for forming a gate electrode, the gate trench being formed in the semiconductor substrate with a smaller depth than the element isolation region and extending through the element region and the element isolation region;

a gate electrode buried in the bottom portion of the gate trench via a gate insulation film;

source and drain regions of a second conductivity type formed in the element region and separated from each other by the gate trench; and a plate electrode which is disposed on the surface of the semiconductor substrate and on the side wall of the gate trench continuously so as to define one of a pair of capacitor electrodes;

wherein the top surface of the gate electrode lies higher than the bottom levels of the source and drain regions and lower than a contact surface of the source and drain regions 6. A semiconductor device comprising:

a semiconductor substrate of a first conductivity type;

a trench type element isolation region formed in a preset depth from the semiconductor substrate surface;

an element region of the first conductivity type surrounded by the element isolation region;

a gate trench for forming a gate electrode, the gate trench being formed in the semiconductor substrate with a smaller depth than the element isolation region and extending through the element region and the element isolation region;

a gate electrode buried in the bottom portion of the gate trench via a gate insulation film;

source and drain regions of a second conductivity type formed in the element region and separated from each other by the gate trench; and a plate electrode which is buried in said gate trench and is opposite to one of said source and drain regions used as a storage node;

wherein the top surface of the gate electrode lies higher than the bottom levels of the source and drain regions and lower than a contact surface of the source and drain regions.

* * * * *